United States Patent
Conway et al.

(10) Patent No.: US 11,742,424 B2
(45) Date of Patent: Aug. 29, 2023

(54) THREE DIMENSIONAL VERTICALLY STRUCTURED ELECTRONIC DEVICES

(71) Applicant: Lawrence Livermore National Security, LLC, Livermore, CA (US)

(72) Inventors: Adam Conway, Livermore, CA (US); Sara Elizabeth Harrison, Fremont, CA (US); Rebecca Nikolic, Oakland, CA (US); Qinghui Shao, Fremont, CA (US); Lars Voss, Livermore, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 53 days.

(21) Appl. No.: 17/143,972

(22) Filed: Jan. 7, 2021

(65) Prior Publication Data

US 2021/0159337 A1 May 27, 2021

Related U.S. Application Data

(62) Division of application No. 15/398,652, filed on Jan. 4, 2017, now Pat. No. 11,024,734, which is a division
(Continued)

(51) Int. Cl.
*H01L 29/772* (2006.01)
*H01L 29/78* (2006.01)
*H01L 29/778* (2006.01)
*H01L 29/20* (2006.01)
*H01L 29/205* (2006.01)
(Continued)

(52) U.S. Cl.
CPC ...... *H01L 29/7827* (2013.01); *H01L 29/0657* (2013.01); *H01L 29/2003* (2013.01);
(Continued)

(58) Field of Classification Search
CPC ............ H01L 29/7788; H01L 29/7787; H01L 29/1095; H01L 29/2003; H01L 29/205;
(Continued)

(56) References Cited

U.S. PATENT DOCUMENTS 10,903,371 B2    1/2021  Conway et al.
2003/0094624 A1*  5/2003  Hshieh ................ H01L 29/7813
                                                            257/139
(Continued)

OTHER PUBLICATIONS

Conway et al., U.S. Appl. No. 17/238,012, filed Apr. 22, 2021.

*Primary Examiner* — Samuel Park
(74) *Attorney, Agent, or Firm* — Zilka-Kotab, P.C.

(57) ABSTRACT

In one embodiment, an apparatus includes at least one vertical transistor, where the at least one vertical transistor includes: a substrate comprising a semiconductor material, an array of three dimensional (3D) structures above the substrate, a gate region, and an isolation region positioned between the 3D structures. Each 3D structure includes the semiconductor material. Each 3D structure also includes a first region having a first conductivity type and a second region having a second conductivity type, the second region including a portion of at least one vertical sidewall of the 3D structure. The gate region is present on a portion of an upper surface of the second region and the gate region is coupled to a portion of the at least one vertical sidewall of each 3D structure.

22 Claims, 15 Drawing Sheets

Related U.S. Application Data of application No. 14/990,612, filed on Jan. 7, 2016, now Pat. No. 11,018,253.

(51) Int. Cl.
  *H01L 29/808* (2006.01)
  *H01L 29/66* (2006.01)
  *H01L 29/06* (2006.01)

(52) U.S. Cl.
  CPC ...... *H01L 29/205* (2013.01); *H01L 29/66924* (2013.01); *H01L 29/7788* (2013.01); *H01L 29/7789* (2013.01); *H01L 29/8083* (2013.01)

(58) Field of Classification Search
  CPC ........... H01L 29/66462; H01L 29/7827; H01L 29/0657; H01L 29/66924; H01L 29/7789; H01L 29/8083
  USPC .................................................. 257/263–267
  See application file for complete search history.

(56) References Cited

U.S. PATENT DOCUMENTS

| | | | |
|---|---|---|---|
| 2006/0049435 A1* | 3/2006 | Bill | H01L 27/10 257/E27.07 |
| 2014/0361349 A1* | 12/2014 | Alexandrov | H01L 29/0619 438/192 |
| 2016/0149001 A1* | 5/2016 | Oxland | H01L 29/161 257/24 |
| 2016/0268446 A1* | 9/2016 | Bhalla | H01L 21/02389 |
| 2019/0371907 A1* | 12/2019 | Nakano | H01L 21/0475 |
| 2021/0328057 A1 | 10/2021 | Conway et al. | |

* cited by examiner

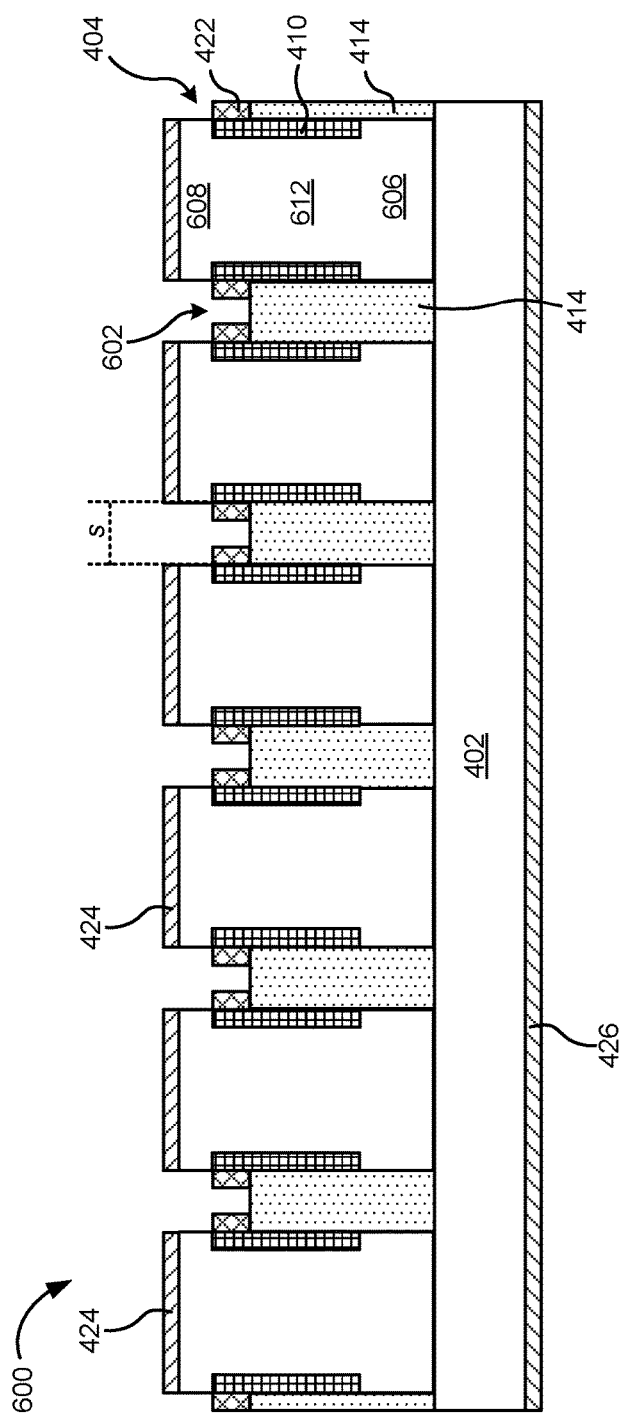
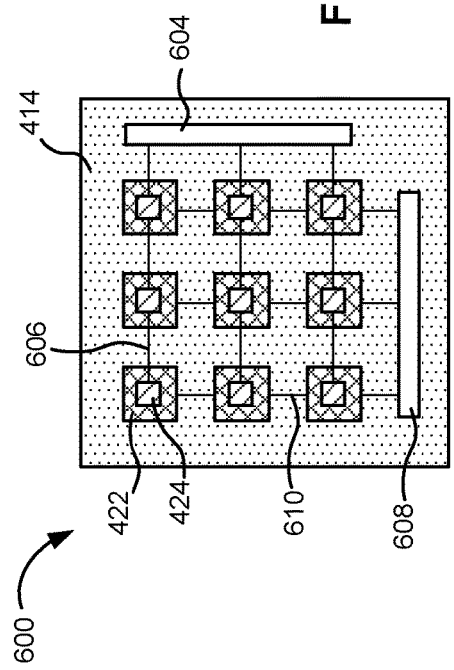
FIG. 6A
FIG. 6B

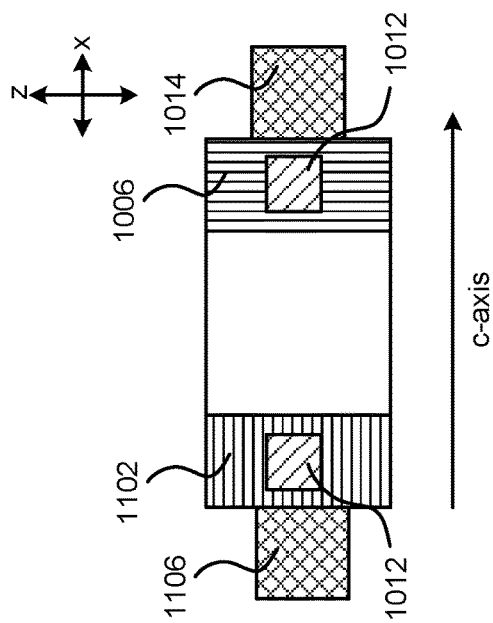
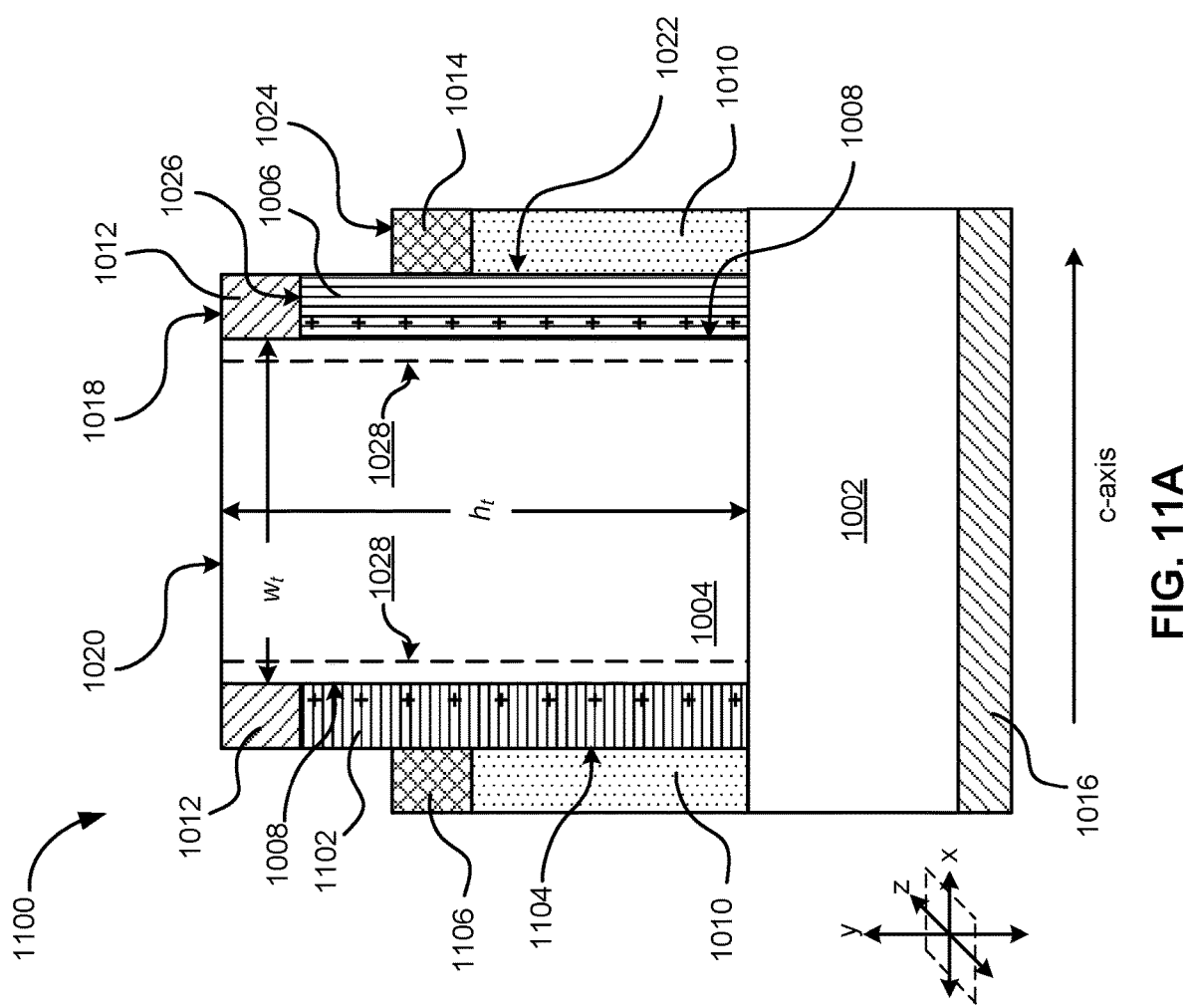

THREE DIMENSIONAL VERTICALLY STRUCTURED ELECTRONIC DEVICES

RELATED APPLICATIONS

The present application is a divisional application of U.S. patent application Ser. No. 15/398,652, filed Jan. 4, 2017, which is a divisional application of U.S. patent application Ser. No. 14/990,612, filed Jan. 7, 2016, from both of which priority is claimed and the contents of both applications are herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to electronic devices, and more particularly to three dimensional vertically structured electronic devices and methods of making the same.

BACKGROUND

Wide bandgap semiconductor materials are used in power electronics due to their ability to withstand higher breakdown voltages and temperatures compared to conventional semiconductors, i.e., silicon. Particular wide bandgap semiconductor materials of interest currently include silicon carbide and diamond. Gallium nitride (GaN) has also emerged as a wide bandgap material of particular interest due to its high electron mobility, saturation velocity and breakdown voltage, which has led to superior power switching performance in terms of conduction loss and switching loss. GaN has a favorable specific on resistance compared to SiC, which gives rise to a more efficient switching device.

Conventional power electronic devices are arranged in a configuration where the current conduction flows parallel to the wafer surface. FIG. 1 illustrates a cross-sectional view of one such conventional lateral GaN transistor 100. This lateral GaN transistor 100 includes an insulating substrate 102 (e.g., comprised of Si, SiC, sapphire, etc.), an insulating buffer layer 104 (e.g., comprised of AN, AlGaN, etc.); an unintentionally doped (UID) GaN layer 106; and an AlGaN layer 108. A source region 110 and a drain region 112 are formed above portions of the UID GaN layer 106 and positioned at opposite sides of the lateral GaN transistor 100. A second insulating layer 114 and a gate region 116 are also formed above the AlGaN layer 108 and positioned between the source and drain regions 110, 112.

The source, drain and gate regions 110, 112, 116 generally each include metal contacts, to which a voltage may be applied. In the "on" state, current flows in a lateral/horizontal direction (as represented by arrow 118) from the source region 110 to the drain region 112 through the two-dimensional electron gas (2-DEG) 120 formed at the AlGaN/GaN heterojunction, and is modulated by the gate region 116. Moreover, in the "off" state, the blocking voltage is held laterally by depleting the 2-DEG between the source and drain regions 110, 112 (see e.g., the region represented by arrow 122).

Lateral GaN transistors, such as that shown in FIG. 1, however, suffer from several disadvantages. For instance, in some high power regimes the size of the lateral transistor is increased to accommodate the larger voltage, which may lead to the increased presence of surface traps that cause current slump and ultimately lower device performance. Additionally, the larger size of the lateral transistor increases not only the cost, but also the complexity of the manufacturing process as field plates are needed to mitigate surface breakdown. Accordingly, there is a need in the art for improved wide bandgap semiconductor devices.

SUMMARY

According to one embodiment, an apparatus includes at least one vertical transistor, where the at least one vertical transistor includes: a substrate comprising a semiconductor material, an array of three dimensional (3D) structures above the substrate, a gate region, and an isolation region positioned between the 3D structures. Each 3D structure includes the semiconductor material. Each 3D structure also includes a first region having a first conductivity type and a second region having a second conductivity type, the second region including a portion of at least one vertical sidewall of the 3D structure. The gate region is present on a portion of an upper surface of the second region and the gate region is coupled to a portion of the at least one vertical sidewall of each 3D structure.

Other aspects and embodiments of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, reference should be made to the following detailed description read in conjunction with the accompanying drawings.

FIG. 6A is a cross-sectional view of a vertical JFET configured as a three dimensional, microstructured array, according to one embodiment.

FIG. 6B is a top down view of the vertical JFET of FIG. 6A.

FIG. 11A is a cross-sectional view of a multi-channel vertical polarization engineered field-effect transistor (VPE-FET), according to one embodiment.

FIG. 11B is a top down view of the multi-channel VPE-FET of FIG. 11A.

DETAILED DESCRIPTION

Figure 1:
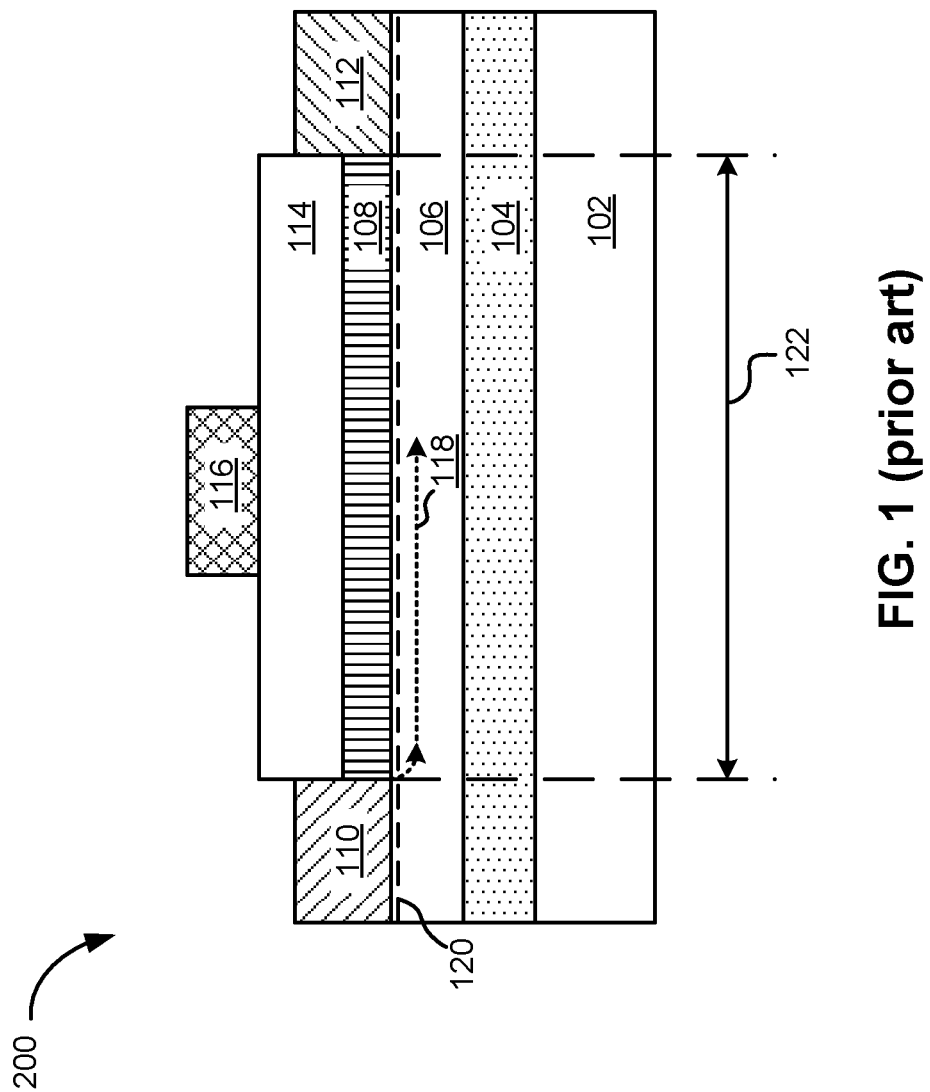
FIG. 1 is a cross-sectional view of a conventional GaN transistor based on a horizontal architecture (i.e., a lateral GaN transistor).

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

As also used herein, the term "about" when combined with a value refers to plus and minus 10% of the reference value. For example, a length of about 1 μm refers to a length of 1 μm±0.1 μm.

It must also be noted that, as used in the specification and the appended claims, the singular forms "a," "an" and "the" include plural referents unless otherwise specified.

The following description discloses several preferred embodiments of three dimensional vertically structured transistors and/or related systems and methods of making the same.

In one general embodiment, a method of forming a vertical transistor includes forming a layer comprising a semiconductor material above a substrate, defining three dimensional (3D) structures in the layer, forming a second region in at least one vertical sidewall of each 3D structure, and forming an isolation region between the 3D structures.

In another general embodiment, an apparatus includes at least one vertical transistor, where the at least one vertical transistor includes: a substrate comprising a semiconductor material, an array of 3D structures above the substrate, and an isolation region positioned between the 3D structures. Each 3D structure includes the semiconductor material. Each 3D structure also includes a first region having a first conductivity type and a second region having a second conductivity type, the second region including a portion of at least one vertical sidewall of the 3D structure.

In yet another general embodiment, an apparatus includes at least one vertical transistor, where the at least one vertical transistor includes: a substrate comprising a first semiconductor material, an array of 3D structures above the substrate, a first sidewall heterojunction layer positioned on at least one vertical sidewall of each 3D structure, an isolation region positioned between the 3D structures, a source region coupled to an upper surface of each 3D structure, a first gate region positioned above the isolation region and coupled to a vertical sidewall of the first sidewall heterojunction layer of each 3D structure, and a drain region coupled to a lower surface of the substrate. Each 3D structure includes the first semiconductor material and the first sidewall heterojunction layer includes a second semiconductor material, where the first and second semiconductor materials have different bandgaps.

In yet another general embodiment, an apparatus includes at least one vertical transistor, where the at least one vertical transistor includes: a substrate comprising a first semiconductor material, at least one 3D structure above the substrate, a heterojunction capping layer above an upper surface of the 3D structure, and a passivation layer positioned on at least one vertical sidewall of the 3D structure. The 3D structure includes the first semiconductor material and the heterojunction capping layer includes a second semiconductor material, where the first and second semiconductor materials have a different bandgap.

As discussed previously, power electronics utilize wide bandgap semiconductor materials due to their favorable electrical and optical properties. Conventional power electronic devices utilizing wide bandgap materials are typically based on horizontal architectures, or a combination of horizontal and vertical architectures. However, these conventional power electronics suffer from current slump issues, increased manufacturing costs and/or complexity, lower device performance, larger than desired device sizes, and other such disadvantages.

Embodiments described herein overcome the aforementioned drawbacks associated with conventional transistors by providing a unique vertical transistor architecture that includes one or more three dimensional (3D) structures (e.g., pillars, ridges, etc.) comprised of one or more wide bandgap semiconductor materials. In various embodiments, the turn-on voltage and the breakdown voltage of these unique vertical transistors may be independently tuned by selecting the diameter and the height of the 3D structures, respectively. In particular embodiments, the one or more three dimensional structures may comprise GaN. Advantages include increased speed, power, and at a reduced cost by using a smaller die size for the same device functionality.

Figure 2:
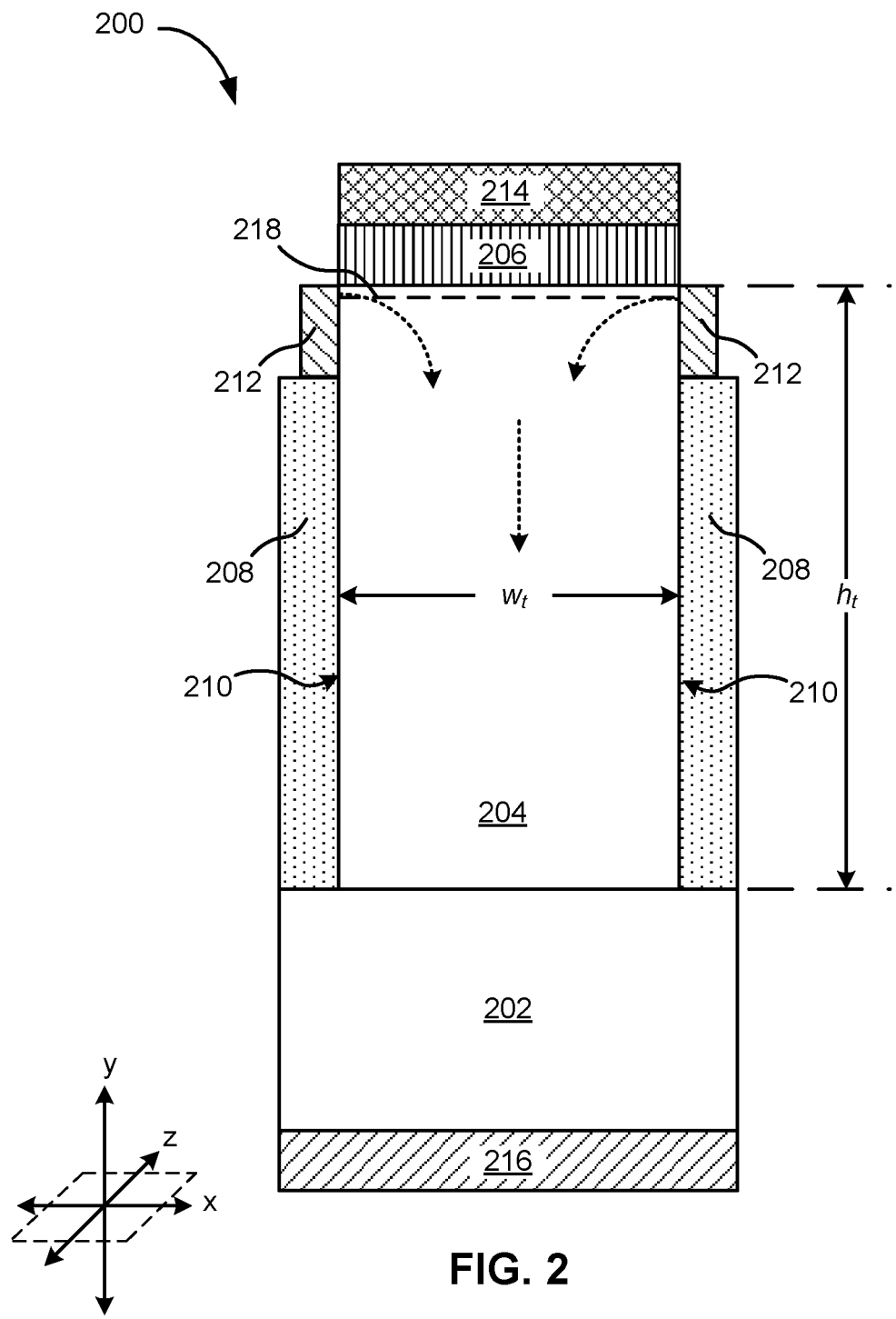
FIG. 2 is a cross-sectional view of a vertical junction field effect transistor (JFET), according to one embodiment.
Figure 3A:
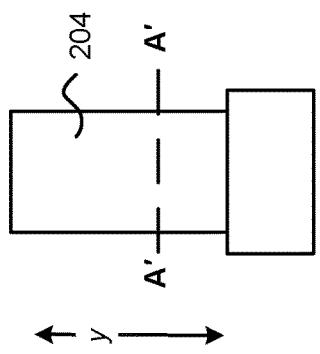
FIGS. 3A-3G show schematics of various cross-sectional shapes of three dimensional structures, according to some embodiments.
Figure 3D:
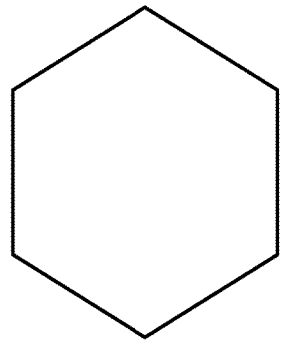
Figure 3G:
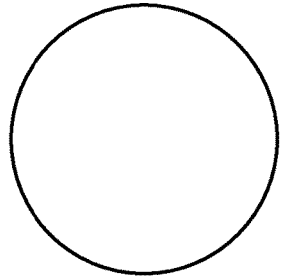
Figure 3C:
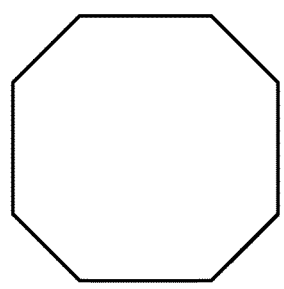
Figure 3F:
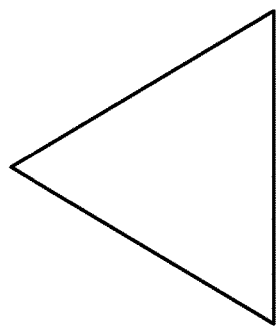
Figure 3B:
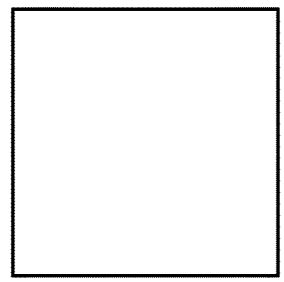
Figure 3E:
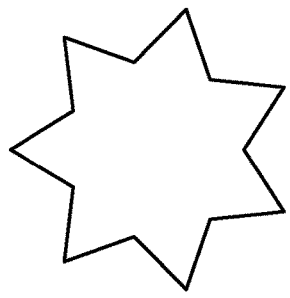

Referring now to FIG. 2, a cross-sectional view of a novel vertical junction field effect transistor (JFET) 200 comprising at least one 3D semiconductor structure is shown, according to one embodiment. As discussed in greater detail later, the vertical JFET 200 includes a gate region and a drain region formed above and below the 3D semiconductor structure, respectively. The vertical JFET 200 also includes a source region positioned between the gate and drain regions, and which is preferably formed along a portion of the sidewall of the 3D semiconductor structure. Current flows in a vertical direction from the source region towards the drain region.

A particular advantage of the vertical JFET 200 is the ability to tune the performance thereof by altering the geometry (e.g., the height and/or the width) of the 3D semiconductor structure. For instance, the breakdown voltage and the threshold (turn on) voltage may each be independently increased by increasing the height and decreasing the width of the 3D semiconductor structure, respectively.

As an option, the vertical JFET 200 may be implemented in conjunction with features from any other embodiment listed herein, such as those described with reference to the other FIGS. Of course, the vertical JFET 200, and others presented herein, may be used in various applications and/or in permutations, which may or may not be specifically described in the illustrative embodiments listed herein. Moreover, unless otherwise specified, one or more components of the vertical JFET 200 may be of conventional material(s), design, and/or fabricated using conventional techniques as would become apparent to one skilled in the art upon reading the present disclosure.

It should be noted that a width of a component of the vertical JFET 200 corresponds to the distance between opposing sides of said component as measured in the horizontal direction (i.e., the direction parallel to an x-z plane of the substrate 202, the z axis depicted in FIG. 2 extending into and out of the page); whereas a height of said component corresponds to the distance between opposing sides thereof as measured in the vertical direction (i.e., the direction perpendicular to an x-z plane of the substrate 202).

As shown in FIG. 2, the vertical JFET 200 includes a substrate 202 comprising a semiconductor material. In various approaches, the substrate 202 may be a polar substrate, a non-polar substrate, a semipolar substrate, etc. In particular approaches, the substrate 202 may include Si, SiC, a binary III-V semiconductor material, a ternary III-V semiconductor material, a quaternary III-V semiconductor material, combinations thereof, etc. In preferred approaches, the substrate 202 may include GaN.

In more preferred approaches, the substrate 202 may have an n+ conductivity type. For instance, in some approaches, the substrate 202 may have an n-type dopant concentration in a range from about $1 \times 10^{16}$ cm$^{-3}$ to about $1 \times 10^{20}$ cm$^3$.

In more approaches, the height of the substrate 202 may be in a range from about 0 to about 1 mm.

As also shown in FIG. 2, at least one 3D structure 204 comprising a semiconductor material is formed above the substrate 202. In particular approaches, the 3D structure 204 may include one or more of the same semiconductor materials as the substrate 202. For instance, in some approaches, the 3D structure 204 may include Si, SiC, a binary III-V semiconductor material, a ternary III-V semiconductor material, a quaternary III-V semiconductor material, combinations thereof, etc. In preferred approaches, the 3D structure 204 may include GaN.

In yet more preferred approaches, the 3D structure 204 may have an n-conductivity type. For example, in some approaches, the 3D structure 204 may have an n-type dopant concentration in a range from about $1 \times 10^{14}$ cm$^{-3}$ to about $1 \times 10^{19}$ cm$^{-3}$.

Suitable n-type dopants for inclusion in the semiconductor material of the substrate 202 and/or the 3D structure 204 may include, but are not limited to, silicon, oxygen, germanium, combinations thereof, etc.

It is important to note, however, that in alternative approaches, the doping profile in the substrate 202 and 3D structure 204 may be inverted to the opposite carrier type (e.g., changed to a p-type doping profile) in order to allow for a p-channel vertical JFET device. Suitable p-type dopants for inclusion in the semiconductor material of the substrate 202 and/or the 3D structure 204 to form a p-channel vertical JFET device may include, but are not limited to, magnesium, beryllium, zinc, carbon, calcium, combinations thereof, etc.

In additional approaches, the total width, $w_t$, of the 3D structure 204 may be in a range from about 0.001 µm to about 100 µm. In more approaches, the total height, $h_t$, of the 3D structure 204 may be in a range from about 0.1 µm to about 1000 µm. In yet more approaches, the 3D structure 204 may have a high aspect ratio. For example, the aspect ratio of the 3D structure 204, defined as the ratio of the greatest height (e.g., $h_t$) of the structure relative to its greatest width (e.g., $w_t$), may be in a range from about 1:1 to about 1000:1 or higher, e.g., about 1:1, about 10:1, about 25:1, about 50:1, and about 100:1. It is important to note that the dimensions (width, height, aspect ratio, etc.) of the 3D structure 204 described herein serve only as an example and are not limiting in any way, as various embodiments may have larger or smaller dimensions.

While not shown in FIG. 2, the vertical JFET 200 may include an array of the 3D structures 204. In such approaches, the 3D structures 204 may be arranged in a hexagonally close packed (HCP) array, a square array, or arranged in any other suitable configuration as would become apparent to one skilled in the art upon reading the present disclosure. In particular approaches where an array of 3D structures 204 is present, the separation between adjacent 3D structures 204 may be in a range from about 0.1 to about 1 mm.

Formation of the 3D structure 204 of FIG. 2 (and an array thereof) may be achieved via top-down processes (e.g., processes involving removal of material) and/or bottom-up processes (e.g., processes involving growing the structure). An exemplary top-down processes may include, but is not limited to: (i) forming a layer comprising an n-type semiconductor material above the substrate 202 (e.g., via molecular beam epitaxy (MBE), plasma assisted molecular beam epitaxy (PAMBE), metal organic molecular beam epitaxy (MOMBE), metal organic vapor phase epitaxy (MOVPE), hydride vapor phase epitaxy (HYPE, MBE), metal organic chemical vapor deposition (MOCVD), plasma enhanced chemical vapor deposition (PECVD), ammonothermal growth, etc.); (ii) applying a patterned mask formed via an optical and/or non-optical lithographic technique (e.g., photolithography, electron-beam lithography, ion-beam lithography, x-ray lithography colloidal/nanosphere lithography, microsphere lithography, nanoimprint lithography, microcontact printing/soft lithography, interference/holographic lithography, etc.); (iii) removing material not covered by the patterned mask via an etching technique (e.g., plasma-based etching, ion-beam milling, metal-assisted chemical etching, electrochemical etching, photo-enhanced chemical etching, dry chemical etching, wet chemical etching, etc.); and (iv) removing the patterned mask after performance of the etching technique. An exemplary bottom-up process may include, but is not limited to, growing the 3D structure(s) 204 via HYPE, MOCVD, MOVPE, MBE, PAMBE, MOMBE, ammonothermal growth methods, catalyst nanowire or microwire growth, catalyst-free nanowire or microwire growth, self-catalyst nanowire or microwire growth, selective area growth, epitaxial lateral overgrowth on a patterned substrate, etc.

With continued reference to FIG. 2, the 3D structure 204 may be a pillar, a ridge, or have any suitable 3D shape as would become apparent to one skilled in the art upon reading the present disclosure. As shown in FIGS. 3A-3G, illustrative, non-limiting cross-sectional shapes of the 3D structure 204, as would be seen if viewed in a cross section along a plane (denoted by line A' in FIG. 3A) oriented perpendicular to its longitudinal axis (y), may include, but is not limited to, a square (FIG. 3B), octagon (FIG. 3C), hexagon (FIG. 3D), star (FIG. 3E), triangle (FIG. 3F), circle (FIG. 3G), etc.

Again with reference to FIG. 2, the vertical JFET 200 includes a heterojunction capping layer 206 formed above the upper surface of the 3D structure 204. This heterojunction capping layer 206 may include a semiconductor material having a different bandgap than the semiconductor material of the 3D structure 204, thus forming a heterojunction between said capping layer 206 and the 3D structure 204. In one particular approach, the heterojunction capping layer 206 may include $Al_xGa_{1-x}N$ ($0 \leq x \leq 1$). In yet another approach, the heterojunction capping layer 206 may include $In_yGa_{1-y}N$ ($0 \leq y \leq 1$). Additional semiconductor materials for the heterojunction capping layer 206 may include, but are not limited to, $B_zGa_{1-z}N$ ($0 \leq z \leq 1$), TlGaN, and other such suitable GaN based alloy configured to provide an electron gas as would become apparent to one skilled in the art upon reading the present disclosure.

In more approaches, a width of the heterojunction capping layer 206, as measured in the horizontal direction, may be about equal to or less than the width of the 3D structure 204. In yet more approaches, a height of the heterojunction capping layer 206, as measured in the vertical direction, may be in a range from about 100 Å to about 1 μm.

Techniques to form the heterojunction capping layer 206 above the 3D structure 204 may include, but are not limited to, MBE, PAMBE, MOMBE, MOCVD, MOVPE, HYPE, ammonothermal growth, etc.

The vertical JFET 200 of FIG. 2 additionally includes a passivation layer 208 formed above the substrate 202 and on a portion of at least one vertical sidewall 210 of the 3D structure 204, where the passivation layer 208 may be configured to reduce or eliminate source to drain leakage. In some approaches, the passivation layer 208 may be present on at least a portion of each vertical sidewall 210 of the 3D structure 204 such that the passivation layer 208 forms a uniform coating around all of said vertical sidewalls 210.

The height of the passivation layer 208 may be less than the height of the 3D structure 204, in various approaches. A suitable height for the passivation layer 208 may be in a range from about 0 to about 100% of the height of the 3D structure 204. Moreover, a suitable width of the passivation layer 208 may in a range from about 1.0 nm to about 10 μm. In approaches where the vertical JFET 200 includes an array of the 3D structures 204, the passivation layer 208 may be present in (and partially or completely fill) the cavity regions between each 3D structure 204.

Suitable materials for the passivation layer 208 may include, but are not limited to, SiNx, $SiO_2$, $TiO_2$, ZnO, BN, B, $Al_2O_3$, $Ga_2O_3$, MgO, $Y_2O_3$, $Gd_2O_3$, combinations thereof, or other such suitable materials as would become apparent to one skilled in the art upon reading the present disclosure. Formation of the passivation layer 208 may be achieved via atomic layer deposition (ALD), MBE, chemical vapor deposition (CVD), low pressure chemical vapor deposition (LPCVD), plasma enhanced chemical vapor deposition (PECVD), electron beam physical vapor deposition, sputtering, and other such application techniques as would become apparent to one skilled in the art upon reading the present disclosure.

The vertical JFET 200 of FIG. 2 further includes a source region 212, a gate region 214 and a drain region 216, to each of which a voltage may be applied. The source, gate and drain regions 212, 214, 216 may each independently include one or more metals (titanium, aluminum, gold, tin, tantalum, tungsten, palladium silver, nickel, platinum, combinations thereof, etc.), and/or one or more conducting oxides, and/or other such suitable material(s) as would become apparent to one skilled in the art upon reading the present disclosure. The source, gate and drain regions 212, 214, 216 may also each independently have a single or multilayered structure. Formation of the source, gate and drain regions 212, 214, 216 may be achieved via ALD, sputtering, electroplating, immersion/encapsulation techniques, e-beam techniques, etc.

As particularly shown in FIG. 2, the source region 212 may be formed above or on the passivation layer 208, and be coupled to at least one vertical sidewall 210 of the 3D structure 204. In some approaches, the source region 212 may be present on at least a portion of each vertical sidewall 210 of the 3D structure 204 such that the source region 212 surrounds the periphery of the 3D structure 204 and forms a direct contact to the 2-DEG 218 positioned below the heterojunction capping layer 206.

In various approaches, the width of source region 212 may be about equal to or less than the width of the passivation layer 208. In particular approaches, the width of the source region 212 may be in a range from about 10 nm to about 10 μm. In the exemplary embodiment shown in FIG. 2, the upper surface of the source region 212 may lie along substantially the same plane as the lower surface of the heterojunction capping layer 206, however this need not be the case. For instance, the upper surface of the source region 212 may extend above, be about equal to, or be below the lower surface of the heterojunction capping layer 206. In specific approaches, the height of the source region 212 may be in a range from about 10 nm to about 10 μm.

As also shown in FIG. 2, the gate region 214 may be formed above, or on, or be otherwise coupled to the upper surface of the heterojunction capping layer 206. The gate region 214 is configured to modulate the 2-DEG 218 formed in the 3D structure 204 at or near the capping layer/3D structure interface, and thus modulate the source to drain current. The drain region 216 may be formed below, or on, or be otherwise coupled to the lower surface of the substrate 202.

As discussed previously, in the "on" state, the current (as represented by the dotted arrows) flows from the source region 212 through the 2-DEG 218, and then in a substantially vertical direction toward the drain region 216. It is important to note that in other approaches, the vertical JFET 200 of FIG. 2 may be configured as a normally off transistor, instead of a normally on transistor.

Figure 4:
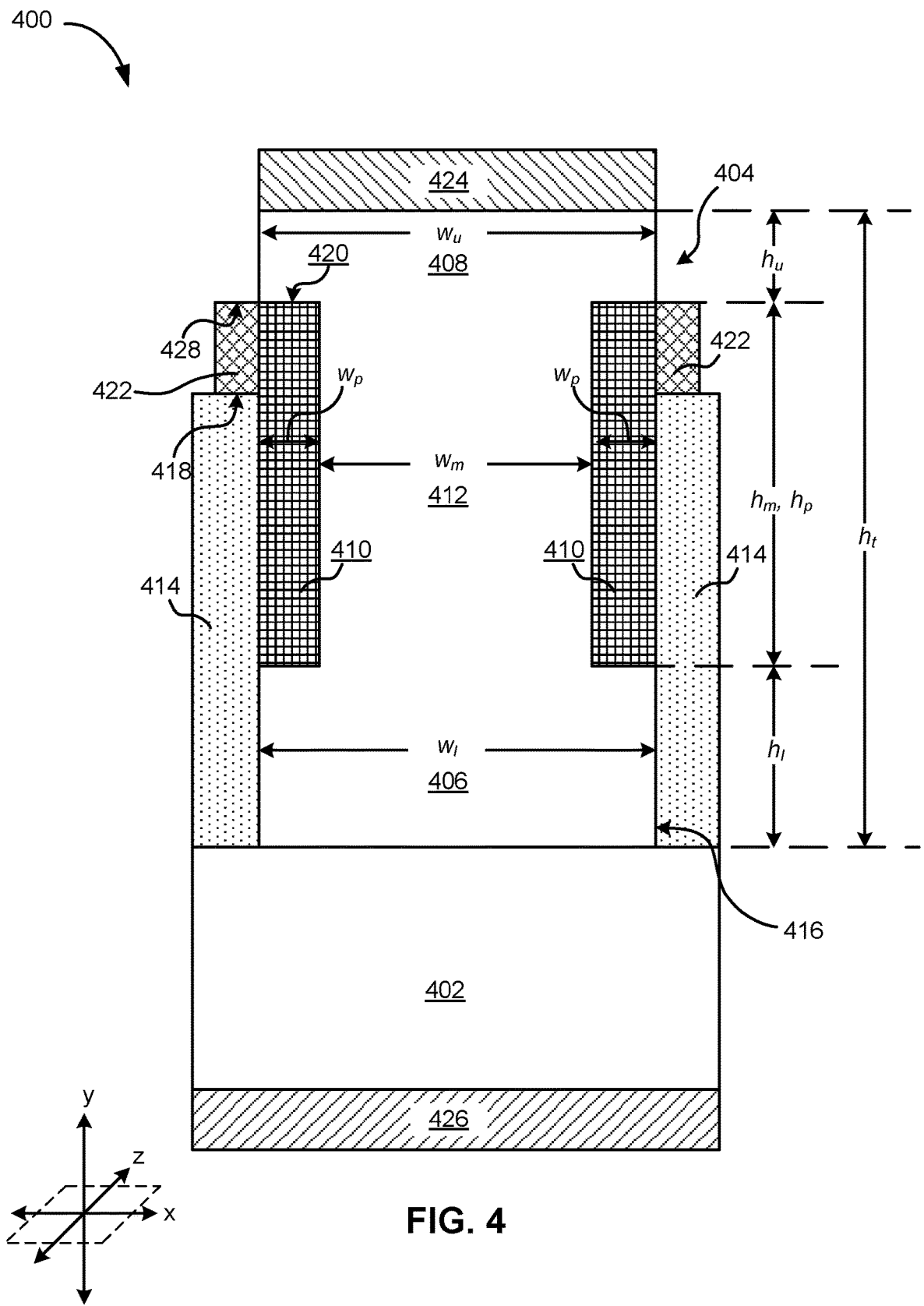
FIG. 4 is a cross-sectional view of a vertical JFET, according to another embodiment.

Referring now to FIG. 4, a second vertical JFET 400 comprising at least one 3D semiconductor structure is shown, according to another embodiment. Similar to the vertical JFET 200 of FIG. 2, current flows in a vertical direction throughout the 3D semiconductor structure of the vertical JFET 400 of FIG. 4. However, in contrast to the vertical JFET 200 of FIG. 2, the vertical JFET 400 of FIG. 4 includes a source region formed above the 3D semiconductor structure thereof, and a gate region preferably formed along a portion of the sidewall of said 3D semiconductor structure. One advantage of the configuration of the vertical JFET 400 (i.e., having the gate region located between the source and drain regions) may be the ability to achieve higher breakdown voltages.

As an option, the vertical JFET 400 may be implemented in conjunction with features from any other embodiment listed herein, such as those described with reference to the other FIGS. Of course, the vertical JFET 400, and other transistors presented herein, may be used in various applications and/or in permutations, which may or may not be specifically described in the illustrative embodiments listed herein. Moreover, unless otherwise specified, one or more components of the vertical JFET 400 may be of conventional material(s), design, and/or fabricated using conventional techniques as would become apparent to one skilled in the art upon reading the present disclosure.

It is of note that a width of a component of the vertical JFET 400 corresponds to the distance between opposing sides of said component as measured in the horizontal direction (i.e., the direction parallel to an x-z plane of the substrate 402, the z axis depicted in FIG. 4 extending into and out of the page); whereas a height of said component corresponds to the distance between opposing sides thereof as measured in the vertical direction (i.e., the direction perpendicular to an x-z plane of the substrate 402).

As shown in FIG. 4, the vertical JFET 400 includes a substrate 402 comprising a semiconductor material. In various approaches, the substrate 402 may be a polar substrate, a non-polar substrate, a semipolar substrate, insulating substrate etc.

In some approaches, the substrate 402 may be an insulating substrate comprising sapphire, glass, quartz, $Al_2O_3$, combinations thereof, etc. However, in approaches where the substrate 402 is an insulating substrate, the drain region 426 (described in greater detail infra) may be coupled to a conductive layer at the bottom of the 3D structure 404, rather than coupled directly to the bottom surface of said substrate 402.

In particular approaches, the substrate 402 may include Si, SiC, a binary III-V semiconductor material, a ternary III-V semiconductor material, a quaternary III-V semiconductor material, combinations thereof, etc. In preferred approaches, the substrate 402 may include GaN.

In more preferred approaches, the substrate 402 may have an n+ conductivity type. For instance, in some approaches, the substrate 402 may have an n-type dopant concentration in a range from about $1 \times 10^{16}$ $cm^{-3}$ to about $1 \times 10^{20}$ $cm^{-3}$. Suitable n-type dopants for inclusion in the semiconductor material of the substrate 402 may include, but are not limited to, silicon, oxygen, germanium, combinations thereof, etc.

In more approaches, the height of the substrate 402 may be in a range from about 0 to about 1000 μm.

The vertical JFET 400 also includes at least one 3D structure 404 comprising a semiconductor material formed above the substrate 402. In various approaches, the 3D structure 404 may include one or more of the same semiconductor materials as the substrate 402. In particular, the 3D structure 404 may include SiC, a binary III-V semiconductor material, a ternary III-V semiconductor material, a quaternary III-V semiconductor material, combinations thereof, etc. In preferred approaches, the 3D structure 404 may include GaN.

As particularly shown in FIG. 4, the 3D structure 404 may include a lower n-type region 406 (also referred to as the drift region), and an upper n-type region 408 (also referred to as the source-gate isolation region) positioned above the lower n-type region 406. The 3D structure 404 may also include a p-type region 410 positioned between the lower and upper n-type regions 406, 408 in the vertical direction, and a middle n-type region 412 positioned between the lower and upper n-type regions 406, 408 in the vertical direction and to one side of the p-type region(s) 410 in the horizontal direction.

As noted above, a portion of one or more of the vertical sidewalls 416 of the 3D structure 404 may include the p-type region 410. In one particular approach, a portion of two vertical sidewalls 416 of the 3D structure 404 may each include p-type regions 410. In other approaches, a portion of each vertical sidewall 416 of the 3D structure 404 may include a p-type region 410.

The n-type regions 406, 408, 412 of the 3D structure 404 may each have an n-type dopant concentration in a range from about $1 \times 10^{14}$ $cm^{-3}$ to about $1 \times 10^{19}$ $cm^{-3}$, and preferably an n-type dopant concentration about $5 \times 10^{16}$ $cm^{-3}$. Suitable n-type dopants for inclusion in the semiconductor material of the n-type regions 406, 408, 412 may include, but are not limited to, silicon, oxygen, germanium, combinations thereof, etc.

The p-type region(s) 410 of the 3D structure 404 may have a p-type dopant concentration in a range from about $1 \times 10^{15}$ $cm^{-3}$ to about $1 \times 10^{20}$ $cm^{-3}$, and preferably a p-type dopant concentration of about $1 \times 10^{18}$ $cm^3$. Suitable p-type dopants for inclusion in the semiconductor material of the p-type regions 410 may include, but are not limited to, magnesium, beryllium, zinc, carbon, calcium, combinations thereof, etc.

It is important to note that, in alternative approaches, the doping profile in the substrate 402 and the regions of the 3D structure 404 may be inverted to the opposite carrier type in order to allow for a p-channel vertical JFET device. For instance, the substrate 402 and the lower, middle, and upper n-type regions 406, 412, 408 of the 3D structure 404 may be altered to have a p-type conductivity rather than an n-type conductivity, whereas the p-type regions 410 may be altered to have an n-type conductivity rather than a p-type conductivity.

The width, $w_l$, of the lower n-type region 406 may be in a range from about 0.001 μm to about 100 μm, in various approaches. Likewise, the width, $w_u$, of the upper n-type region 408 may be in a range from about 0.001 μm to about 100 μm, in numerous approaches. In preferred approaches, $w_u$ may be about equal to or less than $w_l$. In more approaches, the width, $w_m$, of the middle n-type region 412 may be less than $w_l$ and/or $w_u$. In particular approaches, $w_m$ may be in a range from about 99% to about 10% of $w_l$. In yet more approaches, the width, $w_p$, of each p-type region 410 may be in a range from about 10% to about 20% of $w_l$.

In further approaches, the total height, $h_t$, of the 3D structure 404 may be in a range from about 0.1 μm to about 1000 μm. In some approaches, the height, $h_l$, of the lower n-type region 406 may be in a range from greater than 0% to less than or equal to about 100% of $h_t$. In more approaches, the height, $h_m$, of the middle n-type region 412 may be in a range about 0% to about 100% of $h_t$. Likewise, the height, $h_p$, of each p-type region 410 may be in a range from greater than 0% to less than or equal to about 100% of $h_t$, in yet more approaches. In still more approaches, the height, $h_u$, of the upper n-type region 408 may be in a range from greater than 0% to less than or equal to about 100% of $h_t$.

In additional approaches, the 3D structure 404 may have a high aspect ratio. For example, the aspect ratio of the 3D structure 404, defined as the ratio of the greatest height (e.g., $h_t$) of the structure relative to its greatest width (e.g., $w_l$), may be in a range from about 1:1 to about 1000:1 or higher, e.g., about 1:1, about 10:1, about 25:1, about 50:1, and about 100:1. As noted previously, a particular advantage of the vertical JFET 400 is the ability to tune the performance thereof by altering the geometry (e.g., the total height and/or the largest width) of the 3D structure 404. For instance, the breakdown voltage and the threshold (turn on) voltage may each be independently increased by increasing the total height and decreasing the largest width of the 3D structure 404, respectively.

The 3D structure 404 may also be a pillar, a ridge, or have any suitable 3D shape as would become apparent to one skilled in the art upon reading the present disclosure. Furthermore, the cross-sectional shape of the 3D structure 404 may be rectangular, square, triangular, hexagonal, octagonal, rounded, star-shaped, circular, irregular, etc.

It is again important to note that the dimensions (width, height, aspect ratio, etc.), and shape of the 3D structure 404 as disclosed herein serve only as an example and are not limiting in any way, as various embodiments may include larger or smaller dimensions and/or different shapes.

As also shown in FIG. 4, the vertical JFET 400 includes an isolation region 414 positioned above the substrate 402 and on a portion of at least one vertical sidewall 416 of the 3D structure 404. In a particular approach, the isolation region 414 may be positioned on a portion of each vertical sidewall of the 3D structure 404. The isolation region 414 may include a single layer or multilayer structure. Suitable materials for the isolation region 414 may include, but are not limited to polymeric materials, glass, SiNx, $SiO_2$, $Al_2O_3$, $Ga_2O_3$, MgO, $Y_2O_3$, $Gd_2O_3$, air, combinations thereof, and other such suitable electrically insulating material as would become apparent to one skilled in the art upon reading the present disclosure.

In various approaches, the height of the isolation region 414 may be less than the combined height of the lower n-type region 406 and the p-type region 412 ($h_l+h_p$). Stated another way, the upper surface of the 418 of isolation region 414 may be below the upper surface 420 of the p-type region(s) 410.

The vertical JFET 400 of FIG. 4 further includes a gate region 422, a source region 424 and a drain region 426, to each of which a voltage may be applied. The gate, source and drain regions 422, 424, 426 may each independently include one or more metals (titanium, aluminum, gold, tin, tantalum, tungsten, palladium, silver, nickel, platinum, combinations thereof, etc.), and/or one or more conducting oxides, and/or other such suitable material(s) as would become apparent to one skilled in the art upon reading the present disclosure. The gate, source and drain regions 422, 424, 426 may also each independently have a single or multilayered structure.

As particularly shown in FIG. 4, the gate region 422 may be formed above or on the isolation region 414, as well as horizontally adjacent to, on, or otherwise coupled to a portion of the p-type region 410 of at least one vertical sidewall 416 of the 3D structure 404. In some approaches, the gate region 422 may be present on a portion of the p-type region 410 of each vertical sidewall 416 of the 3D structure 404 such that the gate region 422 surrounds the periphery of the 3D structure 404.

In various approaches, the width of the gate region 422 may be less than the width of the isolation region 414. In particular approaches, the width of the gate region 422 may be in a range from about 10 nm to about 10 µm. In the exemplary embodiment shown in FIG. 4, the upper surface 428 of the gate region 422 may lie substantially along the same plane as the upper surface 420 of the p-type region 410; however, this need not be the case. For instance, the upper surface 428 of the gate region 422 may extend above, be about equal to, or below the upper surface 420 of the p-type region 410. In specific approaches, the height of the gate region 422 may be in a range from greater than 0% to less than or equal to about 100% of the p-type region 410.

As also shown in FIG. 4, the source region 424 may be formed above, on, or be otherwise coupled to the upper surface of the 3D structure 404. In various approaches, the width of the source region 424 may be about equal to the width ($w_u$) of the upper n-type region 408 of the 3D structure 404. The drain region 426 may be formed below, or on, or be otherwise coupled to the lower surface of the substrate 402, and may have a width about equal to or less than said substrate 402.

Figure 5:
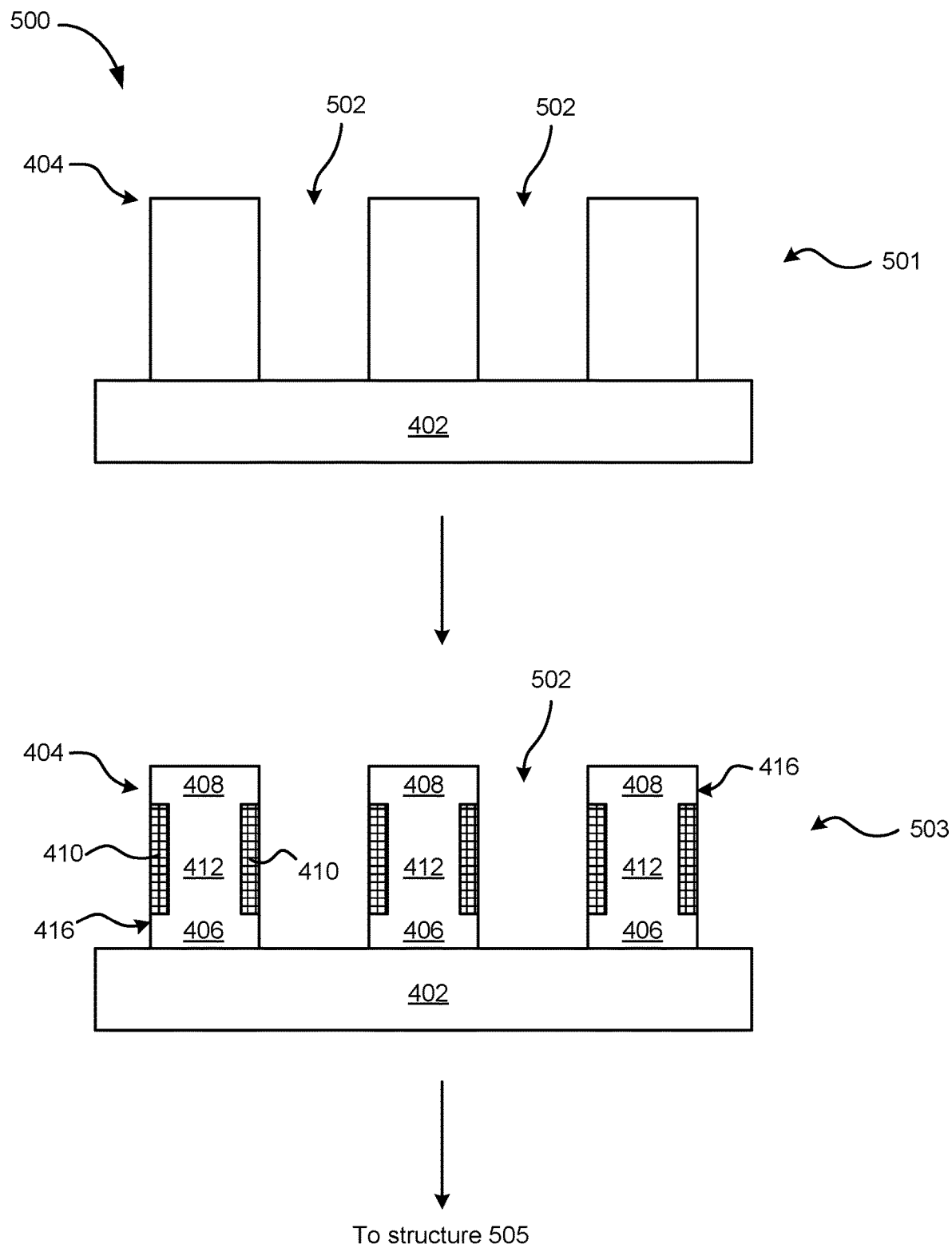
FIG. 5 illustrates a process flow of a method for forming a vertical JFET comprising an array of 3D structures, according to one embodiment.
Figure 5:
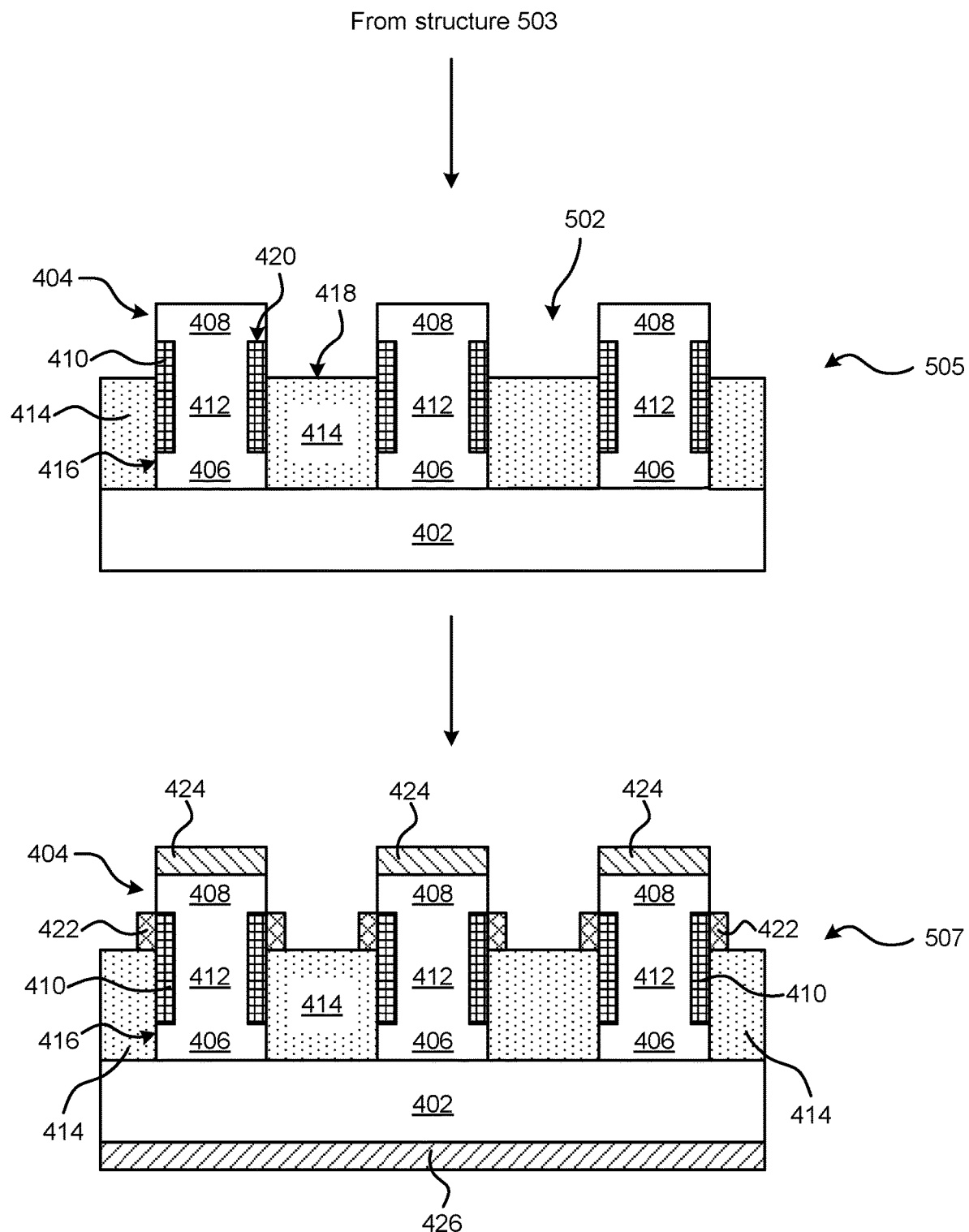

FIG. 5 illustrates a process flow of a method 500 for forming a vertical JFET comprising an array of 3D semiconductor structures, according to one embodiment. FIG. 5 specifically provides cross-sectional views of the vertical JFET in various manufacturing stages. As an option, the present method 500 may be implemented in conjunction with features from any other embodiment listed herein, such as those described with reference to the other FIGS. Of course, the method 500 and others presented herein may be used in various applications and/or in permutations, which may or may not be specifically described in the illustrative embodiments listed herein. Moreover, more or less operations than those shown in FIG. 5 may be included in method 500, according to various embodiments. Furthermore, while exemplary processing techniques are presented with respect to FIG. 5, other known processing techniques may be used for various steps.

It is important to note that the vertical JFET formed via method 500 corresponds to an exemplary variation of the vertical JFET 400 of FIG. 4, and thus may have common numbering with the vertical JFET 400 embodied in FIG. 4.

As shown in FIG. 5, an array of 3D structures 404 having cavity areas 502 there between may be formed above a substrate 402, where the 3D structures 404 and/or the substrate 402 include an n-type semiconductor material. See structure 501. Formation of the array of 3D structures 404 may be achieved by top-down processes (e.g., processes involving removal of material) and/or bottom-up processes (e.g., processes involving growing the structure).

An exemplary top-down process may include first forming a layer comprising an n-type semiconductor material above the substrate. Formation of the layer above the substrate may be achieved via MBE, PAMBE, MOMBE, MOVPE, HYPE, MOCVD, PECVD, ammonothermal growth, etc. A mask having a desired pattern may then be applied to the layer, and material not covered by the mask may be removed to transfer the desired pattern to the layer, thereby forming the 3D structures 404. Several optical and/or non-optical lithographic techniques may be used to form the patterned mask, including but not limited to photolithography, electron-beam lithography, ion-beam lithography, x-ray lithography colloidal/nanosphere lithography, microsphere lithography, nanoimprint lithography, microcontact printing/soft lithography, interference/holographic lithography, etc. Moreover, removal of the material from the layer that is not covered by the mask may be achieved via one or more etching techniques, including but not limited to plasma-based etching, ion-beam milling, metal-assisted chemical etching, electrochemical etching, photo-enhanced chemical etching, dry chemical etching, wet chemical etching, etc. After the 3D structures have been formed via the etching process, the patterned mask may be removed.

An exemplary bottom-up process may include growing the 3D structures 404 via HYPE, MBE, MOCVD, MOVPE, PAMBE, MOMBE, ammonothermal growth methods, catalyst nanowire or microwire growth, catalyst-free nanowire or microwire growth, self-catalyst nanowire or microwire growth, selective area growth, epitaxial lateral overgrowth on a patterned substrate, etc.

As further shown in FIG. 5, a p-type doped region 410 may be formed in at least one vertical sidewall 416, and extends into the interior, of each 3D structure 404. See structure 503. As particularly shown in structure 503, each resulting 3D structure 404 comprises at least one p-type region 410 positioned between (in the vertical direction) a lower n-type region 406 and an upper n-type region 408 (the source-gate isolation region) of said structure. Each resulting 3D structure 404 also comprises a middle region 412 positioned between (in the vertical direction) the lower n-type region 406 and the upper n-type region 408, and to the side (in the horizontal direction) of the p-type region 410.

In one exemplary approach, formation of the p-type region 410 between the lower and upper n-type regions 406, 408 of each 3D structure 404 may include capping the upper surface of each 3D structure 404 with a mask (e.g., a PECVD oxide mask) having a generally mushroom-style shape; and performing a doping process using p-type dopants. The p-type dopants may be introduced via implantation processes (e.g., focused ion-beam implantation, plasma ion immersion implantation, etc.), diffusion processes (e.g., gas/vapor phase diffusion, solid source diffusion, liquid source diffusion, superfluid diffusion, etc.), laser based doping processes, and other suitable doping processes as would become apparent to one skilled in the art upon reading the present disclosure. Use of the mushroom-style mask on the top of each 3D structure 404 may shield the upper areas thereof during the doping process, thus resulting in formation of the upper n-type regions 408 (the source-gate isolation regions) above the p-type regions 410. After the performance of the doping process, the second mask may be removed.

In another exemplary approach, formation of the p-type region 410 may include first implanting p-type dopants to a desired depth in at least one vertical sidewall 416 of each 3D structure 404 using any of the doping techniques described herein. In some approaches, this may achieve a coreshell type structure, with an n-type semiconductor core and a p-type semiconductor shell. After implementation of this doping process, each 3D structure 404 may include at least one p-type region 410, where the p-type region 410 is preferably positioned above the lower n-type region 406 of said structures. However, the upper n-type region 408 of each 3D structure 704 that is configured to isolate the source and gate regions will have yet to be formed. Accordingly, after the p-type doping process, the upper n-type region 408 (the source-gate isolation region) of each 3D structure 404 may be epitaxially regrown to a desired height above the p-type region(s) 410 and the middle n-type region 412.

While not specifically shown in FIG. 5, the p-type region(s) 410 of each 3D structure 404 may be activated via electron beam irradiation, thermal annealing, laser annealing, electromagnetic induction heating, and other suitable activation techniques as would become apparent to one having skill in the art upon reading the present disclosure.

Still with reference to FIG. 5, an isolation region 414 may subsequently be formed in a portion of the cavity areas 502 between the 3D structures 404, where the isolation region 414 preferably forms a conformal coating around the vertical sidewalls 416 of said structures. See structure 505. Formation of the isolation region 414 in the cavity areas 502 may be achieved via spin coating, drop casting, spray coating, CVD, MBE, LPCVD, PECVD, ALD, sputtering, etc.

The upper surface 418 of the isolation region 414 may preferably be below the upper surface 420 of the p-type region(s) 410 in each 3D structure 404. Accordingly, after deposition of the isolation region 414 in the cavity regions 502, the isolation region 414 may be etched back to a desired height and/or planarized, in some approaches. In other approaches, the isolation region 414 may include a self-leveling planarization material and be deposited in the cavity regions 502 to the desired height.

The drift region of each 3D structure 404 may next be formed in the lower n-type region 406 thereof via an additional etching step (not shown in FIG. 5).

As additionally shown in FIG. 5, a gate region 422 is formed above and on the isolation region 414, and on at least one vertical sidewall 416 of each 3D structure 404; a source region 424 is formed on the upper surface/top of each 3D structure 404; and a drain region 426 is formed on the lower surface of the substrate 402. See structure 507. Formation of the gate, source and drain regions 422, 424, 426 may be achieved via ALD, sputtering, electroplating, immersion/encapsulation techniques, and other such suitable application processes as would become apparent to one skilled in the art upon reading the present disclosure.

It is important to note with respect to method 500, that the doping profile in the substrate 402 and the regions of the 3D structure 404 may be inverted to the opposite carrier type (e.g., p-type conductivity to n-type conductivity, and vice versa) in order to allow for formation of a p-channel vertical JFET device, in alternative approaches.

Referring now to FIGS. 6A-6B, a cross-sectional view and a top-down view, respectively, of a vertical JFET 600 including an array of 3D semiconductor structures is shown according to various embodiments. As an option, the vertical JFET 600 may be implemented in conjunction with features from any other embodiment listed herein, such as those described with reference to the other FIGS. Of course, the vertical JFET 600, and other transistors presented herein, may be used in various applications and/or in permutations, which may or may not be specifically described in the illustrative embodiments listed herein. Moreover, unless otherwise specified, one or more components of the vertical JFET 600 may be of conventional material(s), design, and/or fabricated using conventional techniques as would become apparent to one skilled in the art upon reading the present disclosure.

It important to note that the vertical JFET 600 embodied in FIGS. 6A-6B is directed to an exemplary variation of, and thus may have common numbering with, the vertical JFET 400 embodied in FIG. 4.

As shown in FIG. 6A, the vertical JFET 600 includes an array of the 3D structures 404 having cavity regions 602 there between. In such an array, the separation, s, between adjacent 3D structures 404 may be in a range from about 10 nm to about 100 µm. In some approaches, the 3D structures 404 may be arranged in a hexagonally close packed (HCP) array, a square array, or arranged in any other suitable configuration as would become apparent to one skilled in the art upon reading the present disclosure.

As particularly shown in FIG. 6A, the isolation region 414 may be present in a portion of the cavity region 602 between the 3D structures 404. In various approaches, the isolation region 414 present in the cavity regions 602 may extend the full distance between adjacent 3D structures 404 such that the isolation region 414 is in contact with both adjacent structures.

As evident from FIG. 6B, the source regions 424 located on the upper surface/top of each 3D structure 404 may be connected to one another and to a source terminal 604 via source wires 606 or a continuous plane of metal (a source metal layer). As also evident from FIG. 6B, the gate regions 422 may surround each of the 3D structures 404 and be connected to one another and to a gate terminal 608 via gate wires 610 or a continuous plane of metal (a gate metal layer).

Figure 7:
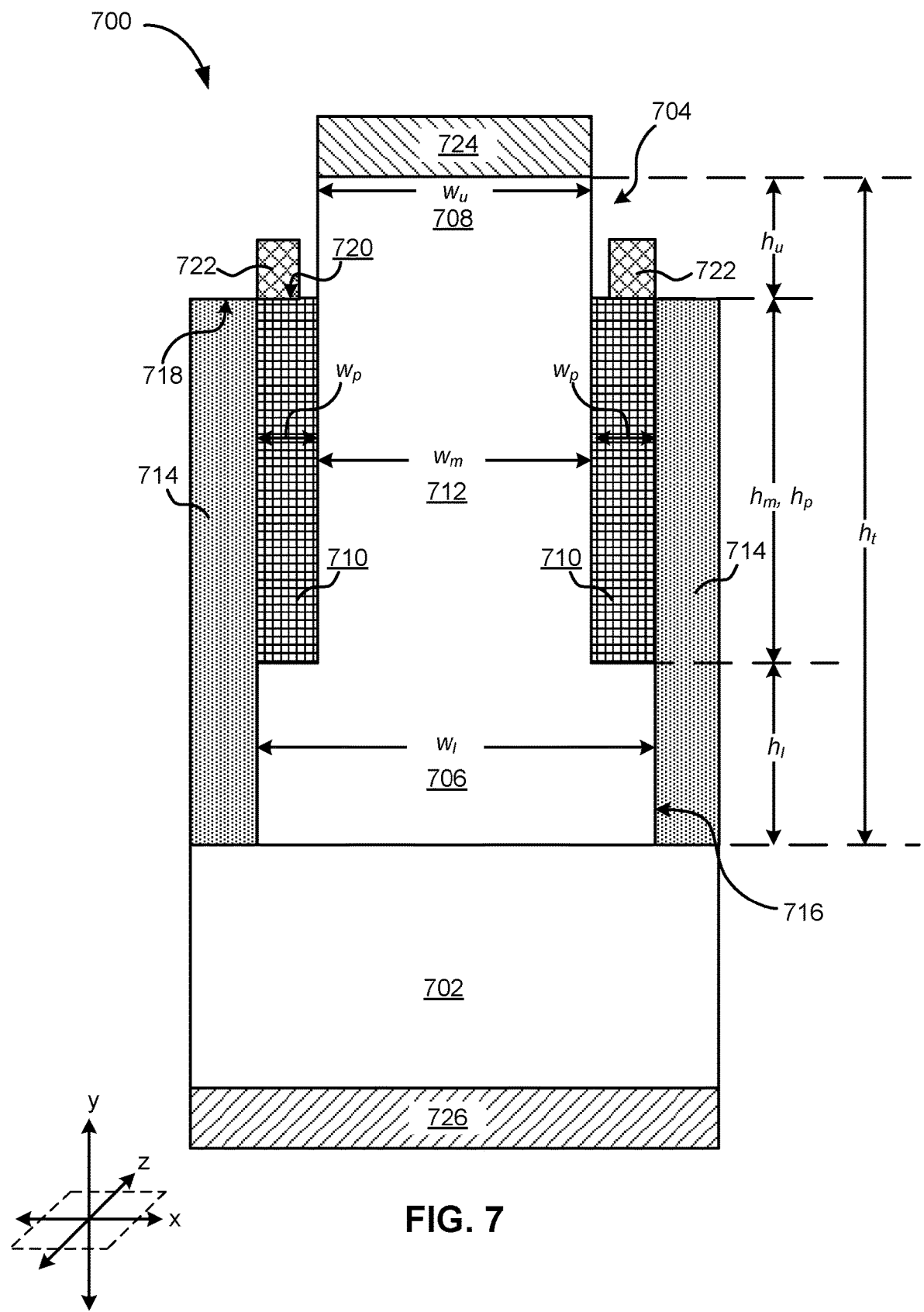
FIG. 7 is a cross-sectional view of a vertical JFET defined via doping (also referred to as a doping defined vertical JFET or DDV-JFET), according to one embodiment.

Referring now to FIG. 7, a novel JFET 700 defined via doping, such as ion implant, diffusion, etch and regrowth or deposition, etc., is shown, according to one embodiment. This vertical JFET 700 may also be referred to herein as a doping defined vertical JFET 700 or DDV-JFET 700. As an option, the DDV-JFET 700 may be implemented in conjunction with features from any other embodiment listed herein, such as those described with reference to the other FIGS. Of course, the DDV-JFET 700, and other transistors presented herein, may be used in various applications and/or in permutations, which may or may not be specifically described in the illustrative embodiments listed herein. Moreover, unless otherwise specified, one or more components of the DDV-JFET 700 may be of conventional material(s), design, and/or fabricated using conventional techniques as would become apparent to one skilled in the art upon reading the present disclosure.

It is of note that a width of a component of the DDV-JFET 700 corresponds to the distance between opposing sides of said component as measured in the horizontal direction (i.e., the direction parallel to an x-z plane of the substrate 702, the z axis depicted in FIG. 7 extending into and out of the page); whereas a height of said component corresponds to the distance between opposing sides thereof as measured in the vertical direction (i.e., the direction perpendicular to an x-z plane of the substrate 702).

As shown in FIG. 7, the DDV-JFET 700 includes a substrate 702 comprising a semiconductor material. In various approaches, the substrate 702 may be a polar substrate, a non-polar substrate, a semipolar substrate, etc. In particular approaches, the substrate 702 may include Si, SiC, a binary III-V semiconductor material, a ternary III-V semiconductor material, a quaternary III-V semiconductor material, combinations thereof, etc. In preferred approaches, the substrate 702 may include GaN.

In more preferred approaches, the substrate 702 may have an n+ conductivity type. For instance, in some approaches, the substrate 702 may have an n-type dopant concentration in a range from about $1 \times 10^{16}$ cm$^{-3}$ to about $1 \times 10^{20}$ cm$^3$. Suitable n-type dopants for inclusion in the semiconductor material of the substrate 702 may include, but are not limited to, silicon, oxygen, germanium, combinations thereof, etc.

In additional approaches, the height of the substrate 702 may be in a range from about 0 to about 1000 μm.

The DDV-JFET 700 also includes at least one 3D structure 704 comprising a semiconductor material formed above the substrate 702. In various approaches, the 3D structure 704 may include one or more of the same semiconductor materials as the substrate 702. In particular, the 3D structure 704 may include SiC, a binary III-V semiconductor material, a ternary III-V semiconductor material, a quaternary III-V semiconductor material, combinations thereof, etc. In preferred approaches, the 3D structure 704 may include GaN.

As particularly shown in FIG. 7, the 3D structure 704 may include a lower n-type region 706 (also referred to as the drift region), and an upper n-type region 708 (also referred to as the source-gate isolation region) positioned above the lower n-type region 706. The 3D structure 704 may also include at least one p-type region 710 positioned above the lower n-type region 706 and below the upper n-type region 708 in the vertical direction, and a middle n-type region 712 positioned between the lower and upper n-type regions 706, 708 in the vertical direction and to one side of the p-type region(s) 710 in the horizontal direction.

As noted above, a portion of one or more vertical sidewalls 716 of the 3D structure 704 may include a p-type region 710. In one particular approach, a portion of two vertical sidewalls 716 of the 3D structure 704 may each include a p-type region 710. In other approaches, a portion of each vertical sidewall 716 of the 3D structure 704 may include a p-type region 710.

The n-type regions 706, 708, 712 of the 3D structure 704 may each have an n-type dopant concentration in a range from about $1 \times 10^{14}$ cm$^{-3}$ to about $1 \times 10^{19}$ cm$^3$, and preferably an n-type dopant concentration about $5 \times 10^{16}$ cm$^3$. Suitable n-type dopants for inclusion in the semiconductor material of the n-type regions 706, 708, 712 may include, but are not limited to, silicon, oxygen, germanium, combinations thereof, etc.

The p-type region(s) 710 of the 3D structure 704 may have a p-type dopant concentration in a range from about $1 \times 10^{15}$ cm$^{-3}$ to about $1 \times 10^{20}$ cm$^{-3}$, and preferably a p-type dopant concentration of about $1 \times 10^{18}$ cm$^3$. Suitable p-type dopants for inclusion in the semiconductor material of the p-type region(s) 710 may include, but are not limited to, magnesium, beryllium, zinc, carbon, calcium, combinations thereof, etc.

It is important to note that, in alternative approaches, the doping profile in the substrate 702 and the regions of the 3D structure 704 may be inverted to the opposite carrier type in order to allow for a p-channel doping defined vertical JFET device. For instance, the substrate 702 and the lower, middle, and upper n-type regions 706, 712, 708 of the 3D structure 704 may be altered to have a p-type conductivity rather than an n-type conductivity, whereas the p-type regions 710 may be altered to have an n-type conductivity rather than a p-type conductivity.

The width, $w_l$, of the lower n-type region 706 may be in a range from about 0.001 μm to about 100 μm in various approaches. In some approaches, the width, $w_m$, of the middle n-type region 712 may be less than $w_l$. In particular approaches, $w_m$ may be in a range from about 0.1% to about 99.9% of $w_l$. In more approaches, the width, $w_p$, of each p-type region 710 may be in a range from about 99.9% to about 0.1% of $w_l$. In yet more approaches, the width, $w_u$, of the upper n-type region 708 may about equal to $w_m$. For instance, in preferred approaches, $w_u$ may be in a range from about 100% to about 1% of $w_l$.

In further approaches, the total height, $h_t$, of the 3D structure 704 may be in a range from about 0.1 μm to about 1000 μm. In some approaches, the height, $h_l$, of the lower n-type region 706 may be in a range from greater than 0% to less than or equal to about 99.9% of $h_t$. In more approaches, the height, $h_m$, of the middle n-type region 712 may be in a range from about 0.1% to about 75% of $h_t$. Likewise, the height, $h_p$, of each p-type region 710 may be in a range from greater than 0% to less than or equal to about 100% of $h_t$, in yet more approaches. In still more approaches, the height, $h_u$, of the upper n-type region 708 may be in a range from greater than 0% to less than or equal to about 25% of $h_t$.

In additional approaches, the 3D structure 704 may have a high aspect ratio. For example, the aspect ratio of the 3D structure 704, defined as the ratio of the greatest height (e.g., $h_t$) of the structure relative to its greatest width (e.g., $w_l$), may be in a range from about 1:1 to about 1000:1 or higher, e.g., about 1:1, about 10:1, about 25:1, about 50:1, and about 100:1.

The 3D structure 704 may also be a pillar, a ridge, or have any suitable 3D shape as would become apparent to one skilled in the art upon reading the present disclosure. Furthermore, the cross-sectional shape of the 3D structure 704 may be rectangular, square, triangular, hexagonal, octagonal, rounded, star-shaped, circular, irregular, etc.

It is again important to note that the dimensions (width, height, aspect ratio, etc.), and shape of the 3D structure 704 as disclosed herein serve only as an example and are not limiting in any way, as various embodiments may include larger or smaller dimensions and/or different shapes.

As also shown in FIG. 7, the DDV-JFET 700 includes an isolation region 714 positioned above the substrate 702 and on a portion of at least one vertical sidewall 716 of the 3D structure 704. In a particular approach, the isolation region 714 may be positioned on a portion of each vertical sidewall of the 3D structure 704. Moreover, in some approaches, the isolation region 714 may include the same semiconductor material as the 3D structure 704, in combination with nitrogen and/or helium dopants.

In various approaches, the height of the isolation region 714 may be about equal to the combined height of the lower n-type region 706 and the p-type region 710 ($h_l+h_p$). Stated another way, the upper surface of the 718 of isolation region 714 may be about equal to the upper surfaces 720 of the p-type region(s) 710.

It is also of note that the method of forming the DDV-JFET 700 may impart particular structural characteristics to the resulting/final DDV-JFET 700. For instance, in some approaches ion implantation may be utilized to form nitrogen and/or helium implanted isolation regions 714, thereby defining the geometry (size, shape, etc.) of the 3D structures 704. Definition of the 3D structure 704 via ion implantation may be an easier process to implement and/or allow a greater area of the vertical JFET to be used as compared to top-down (e.g., etching) processes that remove material to define the 3D structure 704. However, the vertical height of the 3D structure 704 may be limited to a few microns (e.g., about 1 to about 3 μm) due to the ion implantation depth restrictions.

The DDV-JFET 700 of FIG. 7 further includes a gate region 722, a source region 724 and a drain region 726, to each of which a voltage may be applied. The gate, source and drain regions 722, 724, 726 may each independently include one or more metals (titanium, aluminum, gold, tin, tantalum, tungsten, palladium, platinum, nickel, silver, combinations thereof, etc.), and/or one or more conducting oxides, and/or other such suitable material(s) as would become apparent to one skilled in the art upon reading the present disclosure. The gate, source and drain regions 722, 724, 726 may also each independently have a single or multilayered structure.

As particularly shown in FIG. 7, the gate region 722 may be formed above, or on, or be otherwise coupled to an upper surface 720 of the p-type region 710, as well as horizontally adjacent to, or otherwise coupled to a portion of at least one vertical sidewall 716 of the 3D structure 704. In some approaches, the gate region 722 may be present on a portion of the upper surface 720 of each p-type region 710, but may not be in physical contact with the vertical sidewalls 716 of the 3D structure 704. In additional approaches, the gate region 722 may be present on a portion of the upper surface 720 of each p-type region 710, and surround the periphery of the 3D structure 704 without being in physical contact with the vertical sidewalls 716 of the 3D structure 704.

In various approaches, the width of gate region 722 may be about equal to the width of the p-type region 710 positioned below. In particular approaches, the width of the gate region 722 may be in a range from about 10 nm to about 10 μm, and the height of the gate region 722 may be in a range from about 5 nm to about 5 μm.

As also shown in FIG. 7, the source region 724 may be formed above, or on, or be otherwise coupled to the upper surface of the 3D structure 704 (particularly above the upper n-type region 708 of the 3D structure 704, which helps to isolate the gate and source regions 722, 724). In various approaches, the width of the source region 724 may be about equal to the width ($w_u$) of the upper n-type region 708 of the 3D structure 704. The drain region 726 may be formed below, or on, or be otherwise coupled to the lower surface of the substrate 702, and may have a width about equal to or less than said substrate 702.

Figure 8A:
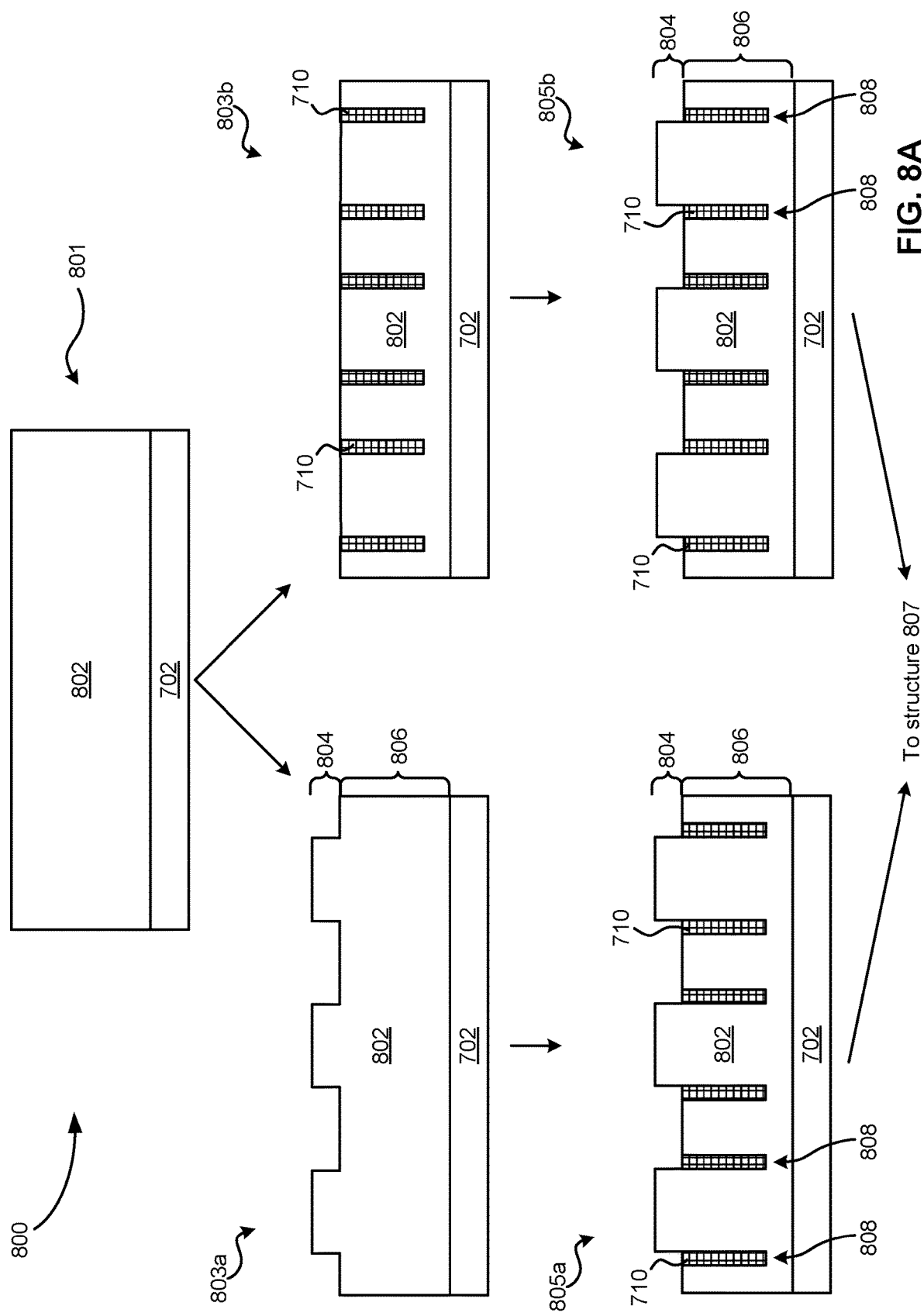
FIGS. 8A-8C illustrate a process flow of a method for forming a DDV-JFET comprising an array of 3D structures, according to various embodiments.
Figure 8A:
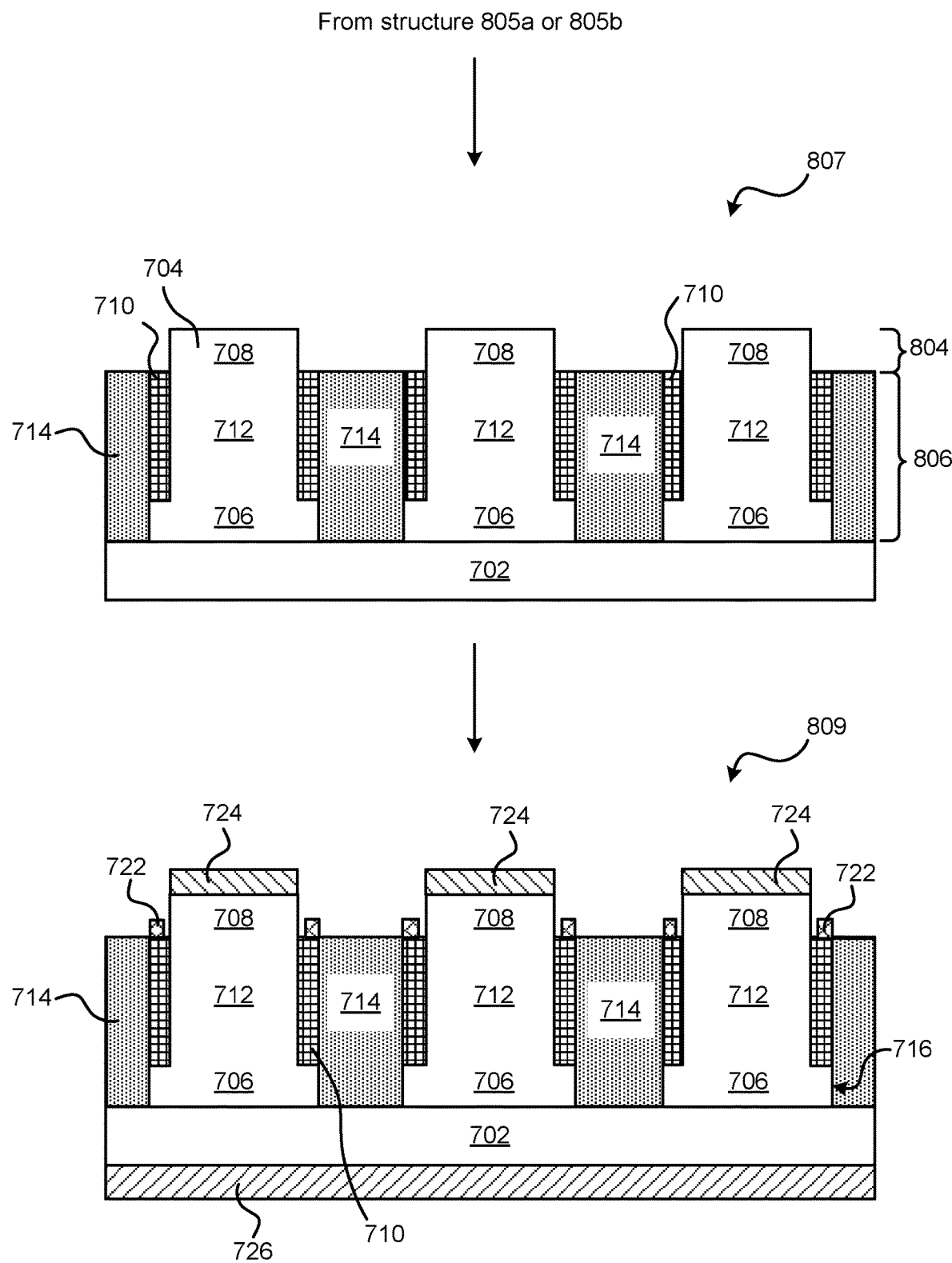

FIG. 8A illustrates a process flow of a method 800 for forming a doping defined vertical JFET comprising an array of 3D structures. FIG. 8A specifically provides cross-sectional views of the doping defined vertical JFET in various manufacturing stages. As an option, the present method 800 may be implemented in conjunction with features from any other embodiment listed herein, such as those described with reference to the other FIGS. Of course, the method 800 and others presented herein may be used in various applications and/or in permutations, which may or may not be specifically described in the illustrative embodiments listed herein. Moreover, more or less operations than those shown in FIG. 8A may be included in method 800, according to various embodiments. Furthermore, while exemplary processing techniques are presented with respect to FIG. 8A, other known processing techniques may be used for various steps.

It is important to note that the vertical JFET formed via method 800 corresponds to an exemplary variation of the DDV JFET 700 of FIG. 7, and thus may have common numbering with the DDV JFET 700 embodied in FIG. 7.

As shown in FIG. 8A, a layer 802 of n-type semiconductor material may be formed above a substrate 702. See structure 801. As discussed below, the to-be-defined 3D structures 704 of the DDV-JFET are formed from this layer 802. Formation of the layer 802 above the substrate may be achieved via any of the deposition and/or growth techniques disclosed herein.

As also shown in FIG. 8A, formation of the upper regions (the source-gate isolation region) of the to-be-defined 3D structures 704 in the layer 802 may be achieved via two exemplary, and non-limiting approaches. For instance, in one exemplary approach, an etching process may be used to form a plurality of protruding regions 804 and recessed regions 806 in the layer 802, where each protruding region 804 corresponds to the upper region (the source-gate isolation region) of a to-be-defined 3D structure 704. See structure 803a. In particular approaches, this etching process may involve: applying, to the upper surface of the layer 802, a lithographic mask having a desired pattern; etching back portions of the layer 802 not covered by the lithographic mask; and removing the lithographic mask from the upper surface of the layer 802.

P-type dopants may next be implanted to a desired vertical depth in at least one portion of each recessed region 806 to form a p-type region 710 of a to-be-defined 3D structure 704. See structure 805a. In preferred approaches, the p-type dopant implantation depth may be less than the vertical height of the recessed regions 806. Stated another way, the vertical height of the resulting p-type regions 710 may be less than the vertical height of the recessed regions 806. Portions 808 of the layer 802 positioned directly below the resulting p-type regions 710 may correspond to part of the lower regions of the to-be defined 3D structures 704. Formation of the p-type region 710 may be achieved via known ion implantation processes, diffusion processes, laser based doping processes, etch and regrowth or deposition process, etc.

Another exemplary approach for forming the upper regions (the source-gate isolation regions) of the to-be-defined 3D structures 704 in the layer 802 may involve selective regrowth of said regions. For instance, after formation of the layer 802 on the substrate 702, p-type dopants may then be implanted to a desired vertical depth in a plurality of regions of the layer 802, where each of these p-doped regions corresponds to a p-type region 710 of a to-be-defined 3D structure 704. See structure 803b. In preferred approaches, the p-type implantation depth may be less than the vertical height of the layer 802. Stated another way, the vertical height of the resulting p-type regions 710 may be less than the vertical height of the layer 802. Portions 808 of the layer 802 positioned directly below the resulting p-type regions 710 may correspond to part of the lower regions of the to-be defined 3D structures 704. Formation of the p-type region 710 may again be achieved via known ion implantation processes, diffusion processes, laser based doping processes, etc.

The layer 802 may then be regrown at selective sites, thereby resulting in protruding and recessed regions 804, 806, where the protruding regions 804 correspond to the upper regions (the source-gate isolation regions) of the to-be-defined 3D structures 704. See structure 805*b*.

After implementation of either exemplary approach described above (or other such suitable approach), nitrogen and/or helium and/or additional insulating dopants may be subsequently implanted to a desired depth in one or more remaining portions (e.g., non-p-type doped portions) of each recessed region 806 to form isolation regions 714. See structure 807. In preferred approaches, the implantation depth of the insulating dopants may be about equal to the vertical height of the recessed regions 806. Stated another way, the vertical height of the resulting isolation regions 714 may be about equal to the vertical height of the recessed regions 806. Formation of the isolation regions 714 may be achieved via known ion implantation processes, diffusion processes, laser based doping processes, etc.

As shown in structure 807, formation of the isolation regions 714 serves to define the 3D structures 704. Each 3D structure 704 includes a lower region 706, an upper region 708 (the source-gate isolation region), at least one p-type region 710 positioned above the lower region 706 and below the upper region 708 in the vertical direction, and a middle region 712 positioned between the lower and upper regions 706, 708 in the vertical direction and to one side of the p-type region 710 in the horizontal direction.

Figure 8B:
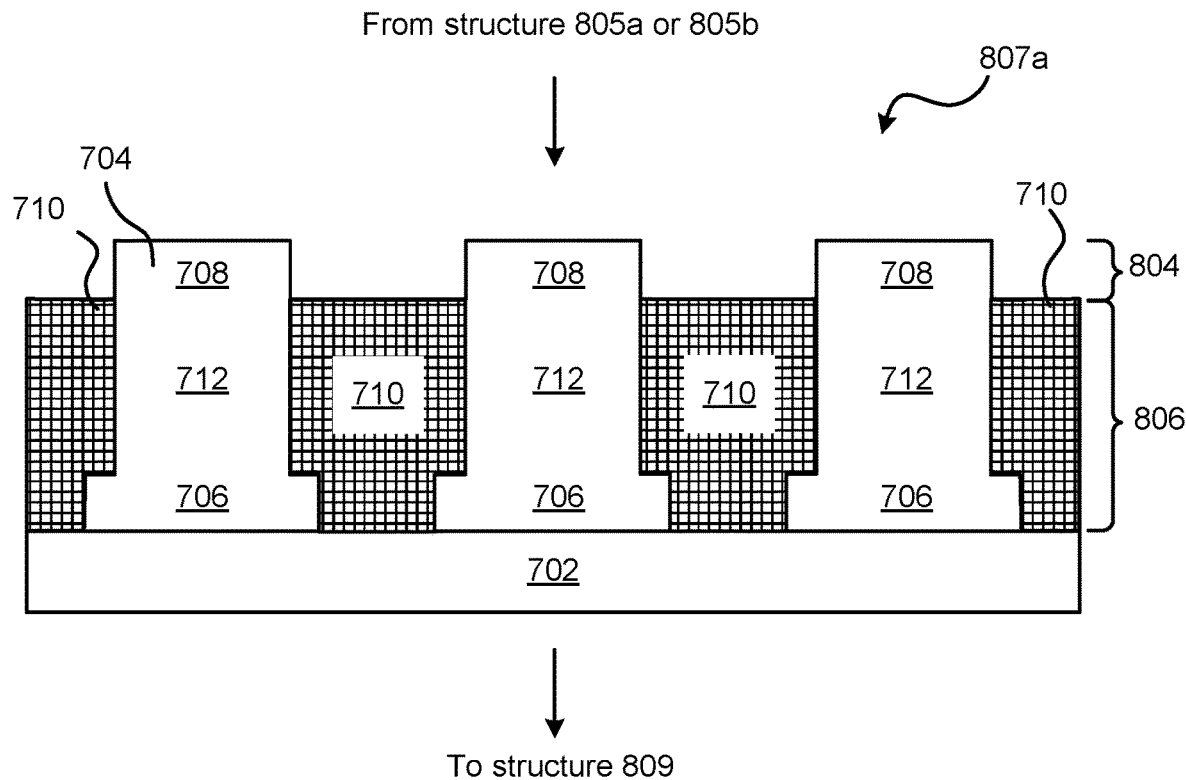
Figure 8C:
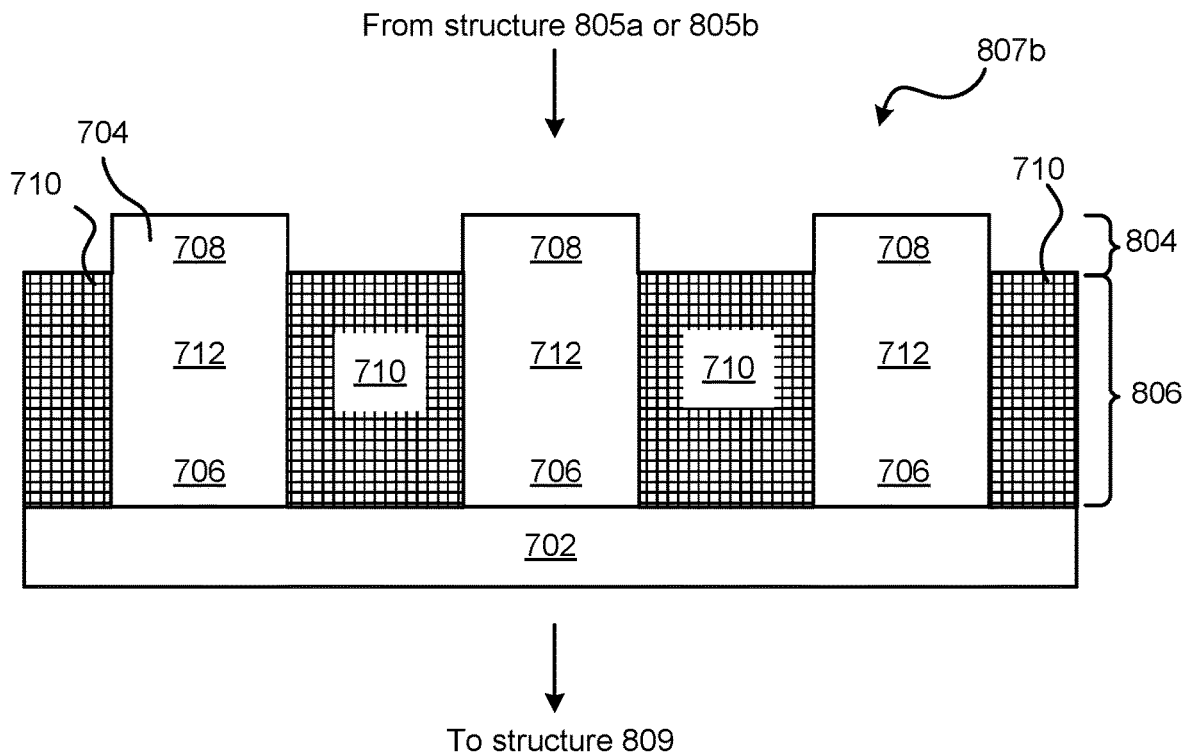

In an alternative approach shown in FIG. 8B, the isolation regions 714 may instead be replaced with the p-type regions 710. See structure 807*a*. In such alternative approaches, the p-type regions 710 may be formed in the recessed regions 806 and extend between adjacent 3D structures 704. Moreover, in other similar approaches where the p-type regions 710 may extend between the 3D structures 704, the lower n-type region 706 of each 3D structure 704 may have a same width as the middle and/or upper n-type regions 712, 708. See structure 807*b* of FIG. 8C.

With continued reference to FIG. 8A, the method 800 additionally includes formation of a gate region 722, a source region 724, and a drain region 726. See structure 809. As particularly shown in structure 809, the gate regions 722 may be formed on a portion of the upper surface of a p-type region 710, and horizontally adjacent to, but preferably not in physical contact with, the vertical sidewalls 716 of the 3D structure 704. The source regions 724 may be formed on the upper surface of the 3D structure 704 (particularly above the upper region 708 of the 3D structure 704, which helps to isolate the gate and source regions 722, 724). The drain region 726 may be formed on the lower surface of the substrate 702.

It is important to note with respect to method 800, that the doping profile in the substrate 702 and the regions of the 3D structure 704 may be inverted to the opposite carrier type (e.g., p-type conductivity to n-type conductivity, and vice versa) in order to allow for formation of a p-channel vertical JFET device, in alternative approaches.

Figure 9A:
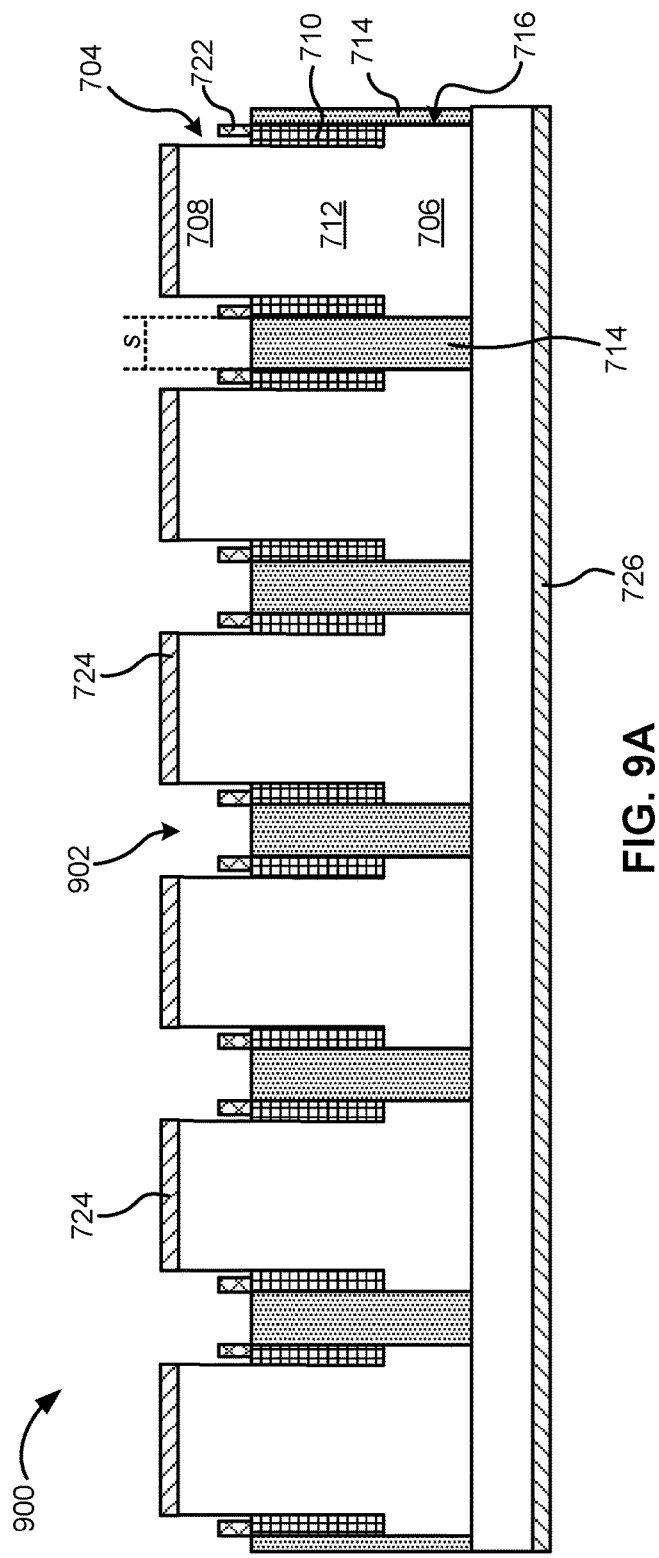
FIG. 9A is a cross-sectional view of a DDV-JFET configured as a three dimensional, microstructured array, according to one embodiment.
Figure 9B:
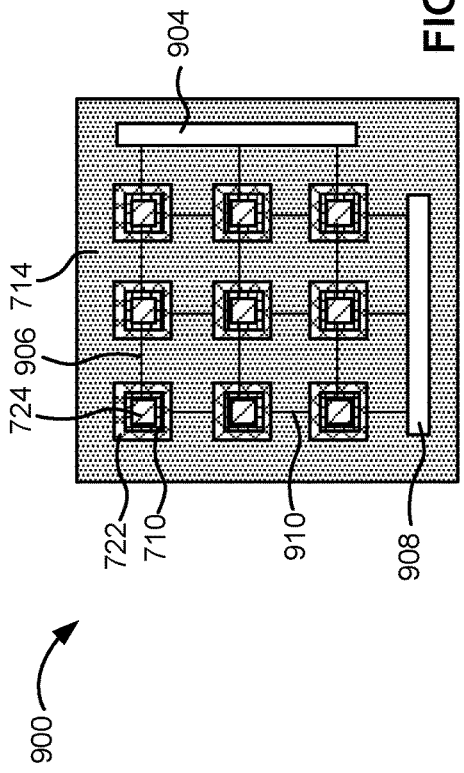
FIG. 9B is a top down view of the DDV-JFET of FIG. 9A.

Referring now to FIGS. 9A-9B, a cross-sectional view and a top-down view, respectively, of a doping defined vertical JFET 900 including an array of 3D structures is shown according to various embodiments. As an option, the doping defined vertical JFET 900 may be implemented in conjunction with features from any other embodiment listed herein, such as those described with reference to the other FIGS. Of course, the doping defined vertical JFET 900, and other transistors presented herein, may be used in various applications and/or in permutations, which may or may not be specifically described in the illustrative embodiments listed herein. Moreover, unless otherwise specified, one or more components of the doping defined vertical JFET 900 may be of conventional material(s), design, and/or fabricated using conventional techniques as would become apparent to one skilled in the art upon reading the present disclosure.

It important to note that the doping defined vertical JFET 900 embodied in FIGS. 9A-9B is directed to an exemplary variation of, and thus may have common numbering with, the DDV JFET 700 embodied in FIG. 7.

As shown in FIG. 9A, the DDV JFET 900 includes an array of the 3D structures 704 having cavity regions 902 there between. In such an array, the separation, s, between the lower n-type regions 706 of adjacent 3D structures 704 may be in a range from about 0 to about 1000 µm. In some approaches, the 3D structures 704 may be arranged in a hexagonally close packed (HCP) array, a square array, or arranged in any other suitable configuration as would become apparent to one skilled in the art upon reading the present disclosure.

As particularly shown in FIG. 9B, the source regions 724 located on the upper surface/top of each 3D structure 704 may be connected to one another and to a source terminal 904 via source wires 906 or a continuous plane of metal (a source metal layer). As also evident from FIG. 9B, the gate regions 722 may surround, yet preferably are not in physical contact with, the vertical sidewalls 716 of each 3D structure 704, and may be connected to one another and to a gate terminal 908 via gate wires 910 or via a continuous plane of metal (gate metal layer).

Figure 10A:
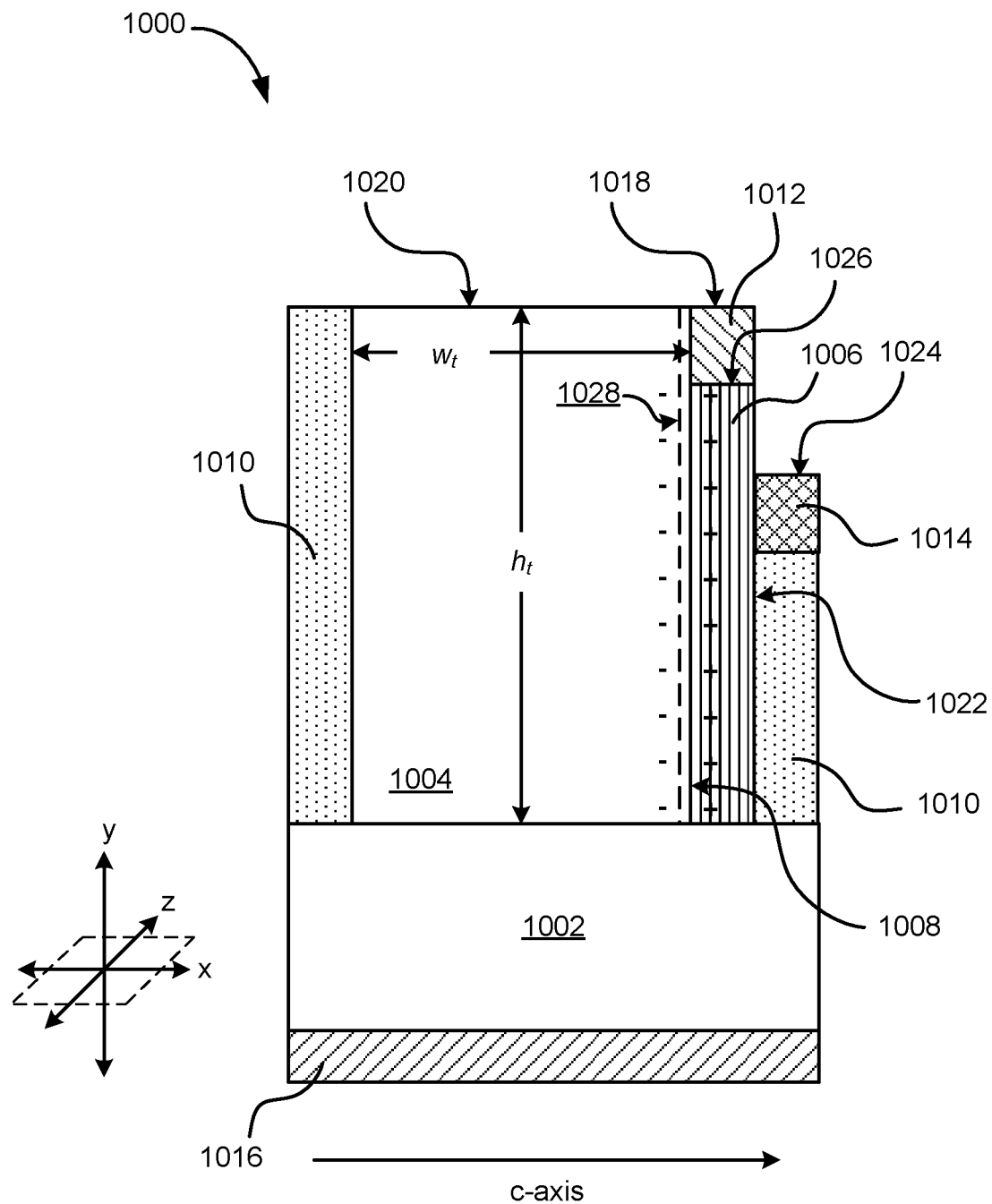
FIG. 10A is a cross-sectional view of a single channel vertical polarization engineered FET (VPE-FET), according to one embodiment.
Figure 10B:
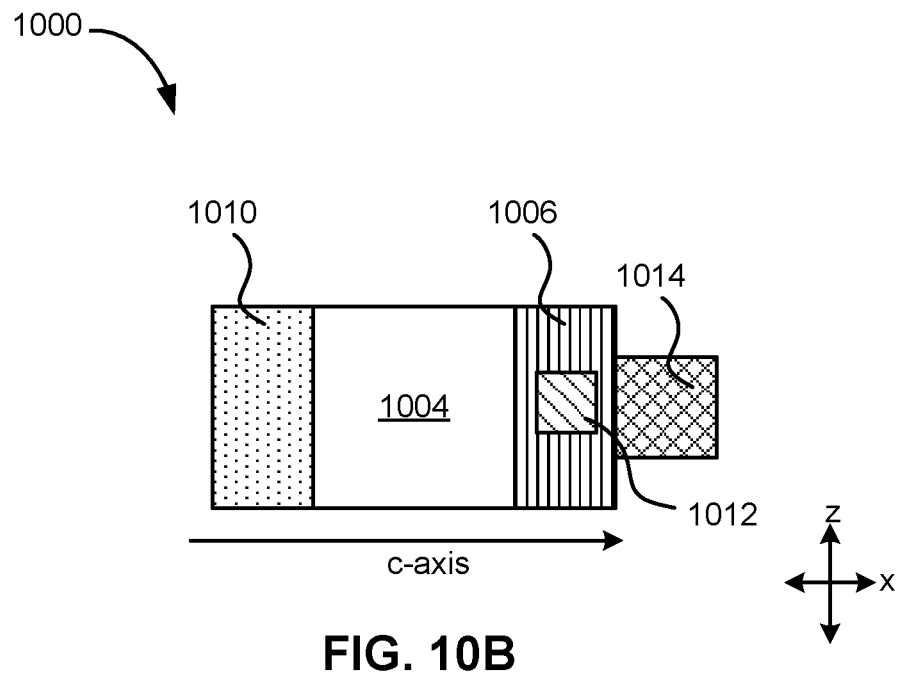
FIG. 10B is a top down view of the VPE-FET of 10A.

Referring now to FIG. 10A, a cross-sectional view of a single channel vertical polarization engineered FET (VPE-FET) 1000 comprising at least one 3D semiconductor structure is shown, according to one embodiment. A top down view of the single channel VPE-FET 1000 is shown in FIG. 10B.

As an option, the VPE-FET 1000 may be implemented in conjunction with features from any other embodiment listed herein, such as those described with reference to the other FIGS. Of course, the VPE-FET 1000, and other transistors presented herein, may be used in various applications and/or in permutations, which may or may not be specifically described in the illustrative embodiments listed herein. Moreover, unless otherwise specified, one or more components of the VPE-FET 1000 may be of conventional material(s), design, and/or fabricated using conventional techniques as would become apparent to one skilled in the art upon reading the present disclosure.

It is of note that a width of a component of the VPE-FET 1000 corresponds to the distance between opposing sides of said component as measured in the horizontal direction (i.e., the direction parallel to an x-z plane of the substrate 1002, the z axis depicted in FIG. 10A extending into and out of the page); whereas a height of said component corresponds to the distance between opposing sides thereof as measured in the vertical direction (i.e., the direction perpendicular to an x-z plane of the substrate 1002).

As shown in FIG. 10A, the VPE-FET 1000 includes a substrate 1002 comprising a semiconductor material. In particular approaches, the substrate 1002 may include Si, SiC, a binary III-V semiconductor material, a ternary III-V semiconductor material, a quaternary III-V semiconductor material, combinations thereof, etc. In preferred approaches, the substrate 1002 may include GaN.

In more preferred approaches, the substrate 1002 may have an n+ conductivity type. For instance, in some approaches, the substrate 1002 may have an n-type dopant concentration in a range from about $1 \times 10^{16}$ cm$^{-3}$ to about $1 \times 10^{20}$ cm$^3$. Suitable n-type dopants for inclusion in the semiconductor material of the substrate 1002 may include, but are not limited to, silicon, oxygen, germanium, combinations thereof, etc.

In additional approaches, the height of the substrate 1002 may be in a range from about 0 to about 1000 µm.

The VPE-FET 1000 also includes at least one 3D structure 1004 comprising a semiconductor material formed above the substrate 1002. In various approaches, the 3D structure 1004 may include one or more of the same semiconductor materials as the substrate 1002. In some approaches, the 3D structure 1004 may include, a binary III-V semiconductor material, a ternary III-V semiconductor material, a quaternary III-V semiconductor material, combinations thereof, etc. In particular approaches, the 3D structure 1004 may include an III-V semiconductor material having a non-centrosymmetric crystal structure with a c-axis orientation parallel to the plane of the substrate 1002 (the x-z plane). In preferred approaches, the 3D structure 1004 may include intrinsic GaN (i GaN) and/or GaN having an n-conductivity type (n-GaN).

In some approaches, the total width, $w_t$, of the 3D structure 1004 may be in a range from about 0.001 µm to about 100 µm. In more approaches, the total height, $h_t$, of the 3D structure 1004 may be in a range from about 0.1 µm to about 1000 µm. In yet more approaches, the 3D structure 1004 may have a high aspect ratio. For example, the aspect ratio of the 3D structure 1004, defined as the ratio of the greatest height (e.g., $h_t$) of the structure relative to its greatest width (e.g., $w_t$), may be in a range from about 1:1 to about 1000:1 or higher, e.g., about 1:1, about 10:1, about 25:1, about 50:1, and about 100:1.

In preferred approaches, the 3D structure 1004 may be a pillar, a ridge, or have any suitable 3D shape as would become apparent to one skilled in the art upon reading the present disclosure. Furthermore, the cross-sectional shape of the 3D structure 1004 may be any shape disclosed herein.

It is again important to note that the dimensions (width, height, aspect ratio, etc.), and shape of the 3D structure 1004 as disclosed herein serve only as an example and are not limiting in any way, as various embodiments may include larger or smaller dimensions and/or different shapes.

The VPE-FET 1000 further includes a sidewall layer 1006 to form a heterojunction, where the heterojunction sidewall layer 1006 is formed above the substrate 1002 and on at least one vertical sidewall 1008 of the 3D structure 1004. The sidewall heterojunction layer 1006 includes a semiconductor material that has a different bandgap than the semiconductor material of the 3D structure 1004. In some approaches, the sidewall heterojunction layer 1006 may include, a binary III-V semiconductor material, a ternary III-V semiconductor material, a quaternary III-V semiconductor material, combinations thereof, etc. In particular approaches, the sidewall heterojunction layer 1006 may include an III-V semiconductor material having a non-centrosymmetric crystal structure with a c-axis orientation parallel to the plane of the substrate 1002 (the x-z plane). In one exemplary approach, the sidewall heterojunction layer 1006 may comprise $Al_xGa_{1-x}N$, where $0 \leq x \leq 1$. In another exemplary approach, the sidewall heterojunction layer 1006 may comprise $In_yGa_{1-y}N$, where $0 \leq y \leq 1$.

In preferred approaches, the 3D structure 1004 and the sidewall heterojunction layer 1006 may each include a different III-V semiconductor material having a non-centrosymmetric crystal structure with a c-axis orientation parallel to the plane of the substrate 1002, where the difference in the spontaneous (pyroelectric) and strain induced (piezoelectric) polarization between the two heterojunction constituents results in the 2-DEG 1028. For instance, in one specific, non-limiting approach, the 3D structure 1004 may comprise GaN (i GaN and/or n-type GaN), and the sidewall heterojunction layer 1006 may comprise $Al_xGa_{1-x}N$ ($0 \leq x \leq 1$). AlGaN and GaN each possess polarized non-centrosymmetric crystal structures, having dipoles across the crystal in the [0001] direction (along the c-axis). In the bulk material (e.g., bulk GaN), the charge imbalance between adjacent dipoles cancels, but bound polarization charge exists at the surface (and is screened by the surface). The difference in spontaneous polarization along the c axis (the [0001] direction) between GaN and AlGaN, gives rise to the 2-DEG 1028 at the GaN/AlGaN interface. Moreover, as the total macroscopic polarization of GaN and AlGaN in the absence of the external electric fields includes spontaneous (pyroelectric), as well as strain induced (piezoelectric) contributions, strain engineering may also be used to form the 2-DEG 1028 at the GaN/AlGaN interface.

In another approach, the 3D structure 1004 may comprise GaN (i GaN and/or n-type GaN), and the sidewall heterojunction layer 1006 may comprise $In_yGa_{1-y}N$ ($0 \leq y \leq 1$), thereby resulting in formation of a two dimensional hole gas (2-DHG) at the GaN/InGaN interface.

As shown in FIG. 10A, the height of the sidewall heterojunction layer 1006 may be less than the height of the 3D structure 1004. Further, the width of the sidewall heterojunction layer 1006 may be in a range from about 1 nm to about 10 µm.

Formation of the sidewall heterojunction layer 1006 on at least one vertical sidewall 1008 of the 3D structure 1004 may be achieved via MOCVD, MOMBE, PAMBE, MOVPE, HYPE, MBE etc.

As also shown in FIG. 10A, the VPE-FET 1000 includes an isolation region 1010 formed above the substrate 1002 and adjacent to, or on, or otherwise coupled to a portion of at least one vertical sidewall 1008 of the 3D structure 1004. An isolation region 1010 may also be present adjacent to, or on, or otherwise coupled to a portion of at least one vertical sidewall 1022 of the sidewall heterojunction layer 1006. The isolation region 1010 may include a single layer or multi-layer structure. Suitable materials for the isolation region may include, but are not limited to, polymeric materials, glass, SiNx, $SiO_2$, $Al_2O_3$, $Ga_2O_3$, MgO, $Y_2O_3$, $Gd_2O_3$, air, combinations thereof, etc.

In various approaches, the height of the isolation region 1010 may be less than the height of the sidewall heterojunction layer 1006. In approaches where the VPE-FET 1000 includes an array of the 3D structures 1004, the isolation region 1010 may be present in (and partially or completely fill) the cavity regions between each 3D structure 1004.

Formation of the isolation region 1010 may be achieved via spin coating, drop casting, spray coating, CVD, MBE, LPCVD, PECVD, ALD, sputtering, etc.

The vertical VPE-FET 1000 further includes a source region 1012, a gate region 1014 and a drain region 1016, to each of which a voltage may be applied. The source, gate and drain regions 1012, 1014, 1016 may each independently include one or more metals (titanium, aluminum, gold, tin, tantalum, tungsten, palladium, silver, nickel, platinum combinations thereof, etc.), and/or one of more conducting oxides, and/or other such suitable material(s) as would become apparent to one skilled in the art upon reading the present disclosure. The source, gate and drain regions 1012, 1014, 1016 may also each independently have a single or multilayered structure. Formation of the source, gate and drain regions 1012, 1014, 1016 may be achieved via ALD, sputtering, electroplating, immersion/encapsulation techniques, evaporation, and other such suitable application processes as would become apparent to one skilled in the art upon reading the present disclosure.

As particularly shown in FIG. 10A, the source region 1012 may be positioned above, or on, or be otherwise coupled to the sidewall heterojunction layer 1006, and horizontally adjacent to, or on, or be otherwise coupled to a portion of at least one vertical sidewall 1008 of the 3D structure 1004. In various approaches, the width of source region 1012 may be about equal to or less than the width of the isolation region 1010. In particular approaches, the width of the source region 1012 may be in a range from about -10 nm to about 10 μm. In the exemplary embodiment shown in FIG. 10A, the upper surface 1018 of the source region 1012 may lie along substantially the same plane as the upper surface 1020 of the 3D structure 1004; however, this need not be the case. For instance, the upper surface 1018 of the source region 1012 may extend above, be about equal to, or below the upper surface 1020 of the 3D structure 1004.

The gate region 1014 may be formed above or on the isolation region 1010, and horizontally adjacent to, or on, or be otherwise coupled to a portion of at least one vertical sidewall 1022 of the sidewall heterojunction layer 1006. In various approaches, the upper surface 1024 of the gate region may be below the lower surface 1026 of the source region 1012. In particular approaches, the height of the gate region 1014 may be greater than 0% to less than 100% of the sidewall heterojunction layer 1006. The width of the gate region 1014 may be in a range from about 10 nm to about 10 μm. The drain region 1016 may be formed below, or on, or otherwise coupled to the lower surface of the substrate 1002.

While not shown in FIGS. 10A-10B, the vertical VPE-FET 1000 may include an array of the 3D structures 1004. In such approaches, the 3D structures 1004 may be arranged in a hexagonally close packed (HCP) array, a square array, or arranged in any other suitable configuration as would become apparent to one skilled in the art upon reading the present disclosure. In particular approaches where an array of 3D structures 1004 is present, the separation between adjacent 3D structures 1004 may be in a range from about 0.1 to about 1 mm.

Figure 10C:
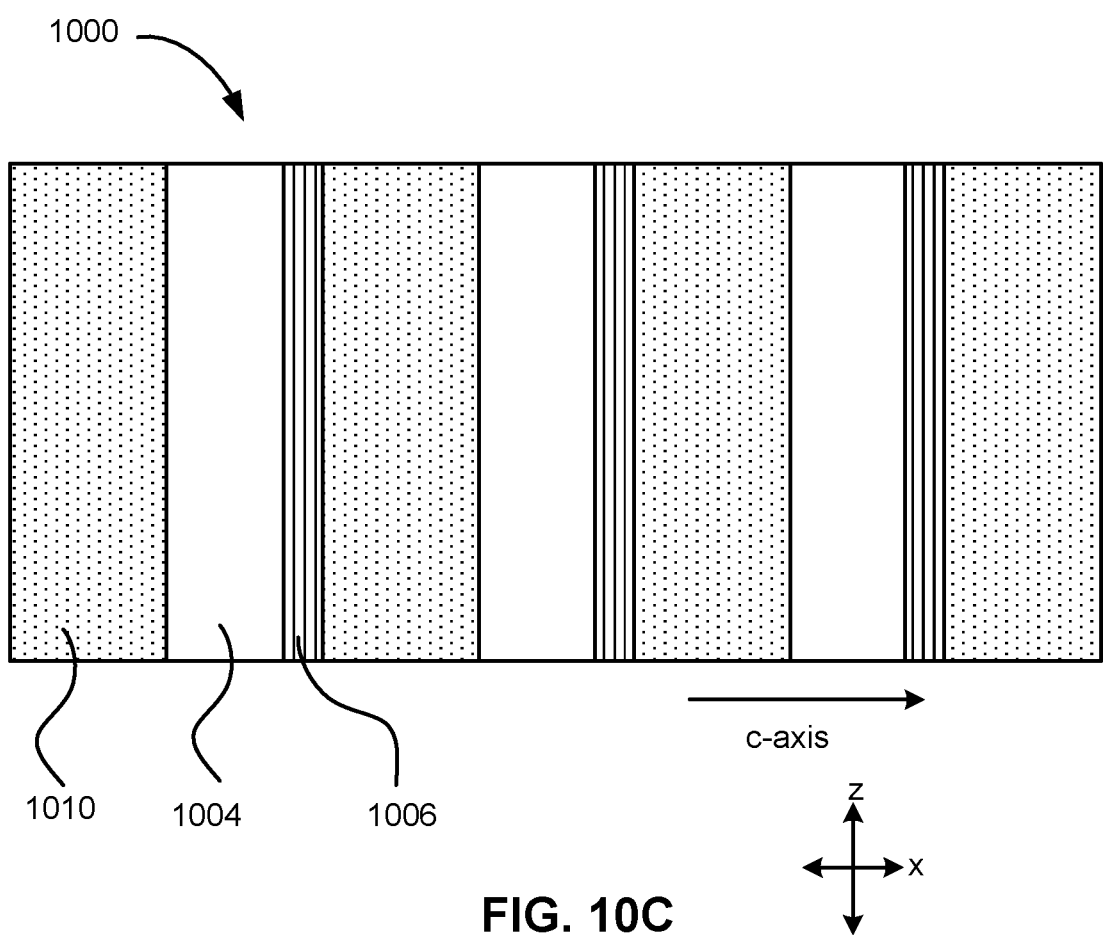
FIG. 10C is a top down view of the single channel VPE-FET of 10A configured as a microstructured array comprising ridge structures, according to one embodiment.

FIG. 10C provides a top down view of an exemplary, non-limiting embodiment in which the VPE-FET 1000 includes an array of the 3D structures 1004 where the 3D structures are ridges. As particularly shown in FIG. 10C, the sidewall heterojunction layer 1006 and the isolation region 1010 are formed on opposing, vertical sidewalls 1008 of each 3D structure 1004. Note, the source and gate regions 1012, 1014 have been omitted from FIG. 10C for clarity.

Referring now to FIG. 11A, a cross-sectional view of a multi-channel vertical polarization engineered FET (VPE-FET) 1100 is shown according to one embodiment. A top down view of the multi-channel VPE-FET 1100 is shown in FIG. 11B.

As an option, the VPE-FET 1100 may be implemented in conjunction with features from any other embodiment listed herein, such as those described with reference to the other FIGS. Of course, the VPE-FET 1100, and other transistors presented herein, may be used in various applications and/or in permutations, which may or may not be specifically described in the illustrative embodiments listed herein. Moreover, unless otherwise specified, one or more components of the VPE-FET 1100 may be of conventional material(s), design, and/or fabricated using conventional techniques as would become apparent to one skilled in the art upon reading the present disclosure.

It is of note that a width of a component of the VPE-FET 1100 corresponds to the distance between opposing sides of said component as measured in the horizontal direction (i.e., the direction parallel to an x-z plane of the substrate 1002, the z axis depicted in FIG. 11A extending into and out of the page); whereas a height of said component corresponds to the distance between opposing sides thereof as measured in the vertical direction (i.e., the direction perpendicular to an x-z plane of the substrate 1002).

It also important to note that the VPE-FET 1100 embodied in FIGS. 11A-11B is directed to an exemplary variation of, and thus may have common numbering with, the VPE-FET 1000 embodied in FIGS. 10A-10B.

As shown in FIGS. 11A-11B, the VPE-FET 1100 includes the sidewall heterojunction layer 1006 (also referred to as the first sidewall heterojunction layer 1006) positioned above the substrate 1002 and on at least one vertical wall 1008 of the 3D structure 1004. The VPE-FET 1100 also includes a second sidewall heterojunction layer 1102 positioned above the substrate 1002 and on at least another of the vertical walls 1008 of the 3D structure 1004. The second sidewall heterojunction layer 1102 may preferably comprise a semiconductor material having a different bandgap than the semiconductor material of the 3D structure 1004 and/or the semiconductor material of the first sidewall heterojunction layer 1006.

In some approaches, the second sidewall heterojunction layer 1102 may include, a binary III-V semiconductor material, a ternary III-V semiconductor material, a quaternary III-V semiconductor material, combinations thereof, etc. In particular approaches, the second sidewall heterojunction layer 1102 may include an III-V semiconductor material having a non-centrosymmetric crystal structure with a c-axis orientation parallel to the plane of the substrate 1002 (the x-z plane).

In one approach, the second sidewall heterojunction layer 1102 may comprise $Al_xGa_{1-x}N$, where $0 \le x \le 1$. In another exemplary approach, the second sidewall heterojunction layer 1102 may comprise $In_yGa_{1-y}N$, where $0 \le y \le 1$.

In preferred approaches, the 3D structure 1004 and the second sidewall heterojunction layer 1102 may each include a different III-V semiconductor material having a non-centrosymmetric crystal structure with a c-axis orientation parallel to the plane of the substrate 1002, where the difference in the spontaneous (pyroelectric) and strain induced (piezoelectric) polarization between the two heterojunction constituents results in the 2-DEG (or alternately a 2-DHG) 1028. For instance, in one specific, non-limiting approach, the 3D structure may comprise GaN (i GaN and/or n-type GaN), and the second sidewall heterojunction layer 1102 may comprise $Al_xGa_{1-x}N$ ($0 \le x \le 1$), thereby giving rise to the 2-DEG 1026 at the GaN/AlGaN interface. In another approach, the 3D structure 1004 may comprise GaN (i GaN and/or n-type GaN), and the second sidewall heterojunction layer 1102 may comprise $In_yGa_{1-y}N$ ($0 \le y \le 1$), thereby resulting in formation of a two dimensional hole gas (2-DHG)) at the GaN/InGaN interface.

In some approaches, the first sidewall heterojunction layer 1006 and the second sidewall heterojunction layer 1102 may comprise one or more of the same semiconductor materials as one another. For instance, in such approaches, the first and second sidewall heterojunction layers 1006, 1102 may each include $Al_xGa_{1-x}N$ (0≤x≤1). Additionally, in such approaches, the first and second sidewall heterojunction layers 1006, 1102 may each include $In_yGa_{1-y}N$, (0≤y≤1).

In other approaches, the first sidewall heterojunction layer 1006 and the second sidewall heterojunction layer 1102 may comprise one or more different semiconductor materials as one another. For example, in preferred approaches, the first sidewall heterojunction layer 1006 may comprise $Al_xGa_{1-x}N$ (0≤x≤1), and the second sidewall heterojunction layer 1102 may comprise $In_yGa_{1-y}N$ (0≤y≤1) or vice versa.

As particularly shown in FIG. 11A, the height of the second sidewall heterojunction layer 1102 may be less than the height of the 3D structure 1004, Further, the width of the second sidewall heterojunction layer 1102 may be in a range from about 1 nm to about 10 µm.

Formation of the second sidewall heterojunction layer 1102 on at least one vertical sidewall 1008 of the 3D structure 1004 may be achieved via MOCVD, MOMBE, PAMBE, MOVPE, HYPE, MBE, etc.

As also shown in both FIGS. 11A-11B, a source region 1012 may be formed above, or on, or be otherwise coupled to the second sidewall heterojunction layer 1102, and horizontally adjacent to, or on, or be otherwise coupled to a portion of at least one sidewall 1008 of the 3D structure 1004.

An isolation region 1010 may additionally be adjacent to, or on, or otherwise coupled to at least a portion of at least one vertical sidewall 1104 of the second sidewall heterojunction layer 1102. A second gate region 1106, to which a voltage may be applied, may also be formed above, or on, the isolation region 1010, and horizontally adjacent to, or on, or otherwise coupled to a portion of at least one vertical sidewall 1104 of the second sidewall heterojunction layer 1102. Suitable materials for the second gate region 1106 may include, but are not limited to, one or more metals (titanium, aluminum, gold, tin, tantalum, tungsten, palladium, silver, nickel, platinum, combinations thereof, etc.), and/or one or more conducting oxides, and/or other such suitable material(s) as would become apparent to one skilled in the art upon reading the present disclosure. Formation of the second gate region 1106, similar to the source, gate and drain regions 1012, 1014, 1016, may be achieved via ALD, sputtering, electroplating, immersion/encapsulation techniques, evaporation, and other such suitable application processes as would become apparent to one skilled in the art upon reading the present disclosure.

In some approaches, the vertical channel current formed at the interface between the first sidewall heterojunction layer 1006 and the 3D structure 1004 may be controlled via gate region 1014, whereas the vertical channel current formed at the interface between the second sidewall heterojunction layer 1102 and the 3D structure 1004 may be independently controlled via the second gate region 1106. While the gate regions 1014, 1106 may be independently controllable to independently influence their respective vertical channel currents formed at the aforementioned interfaces, in other approaches, said gate regions 1014, 1106 may be controlled together to exert a similar influence on their respective vertical channel currents.

Applications/Uses

Embodiments of the present invention may be used in a wide variety of applications, particularly those applications which utilize power electronic devices. For instance, the vertical transistors disclosed herein be used in high powered electrical switches, amplifiers, power transmitters, motor drivers, etc.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
at least one vertical transistor, comprising:
   a substrate comprising a semiconductor material;
   an array of three dimensional (3D) structures above the substrate, wherein each 3D structure comprises the semiconductor material, wherein each 3D structure comprises a first region having a first conductivity type and a second region having a second conductivity type, the second region including a portion of at least one vertical sidewall of each 3D structure, the second region being positioned to one side of a portion of the first region in a horizontal direction, the horizontal direction being oriented parallel to an upper surface of the substrate;
   a gate region, wherein the gate region is present on a portion of an upper surface of the second region and the gate region is coupled to a portion of the at least one vertical sidewall of each 3D structure; and
   an isolation region positioned between each 3D structure,
   wherein the isolation region is positioned directly on the substrate,
   wherein the isolation region is an electrically insulating material.

2. The apparatus as recited in claim 1, wherein the first conductivity type corresponds to a n-type conductivity, and the second conductivity type corresponds to a p-type conductivity.

3. The apparatus as recited in claim 1, wherein the at least one vertical transistor comprises:
   a source region coupled to an upper surface of each 3D structure, a drain region coupled to a lower surface of the substrate,
   wherein the first region of each 3D structure comprises an upper region positioned above the second region, the upper region being configured to isolate the source and gate regions.

4. The apparatus as recited in claim 3, wherein the first region of each 3D structure comprises a lower region below the upper region and a middle region between the upper and lower regions in a vertical direction, wherein the second region is positioned between the isolation region and the middle region and/or the upper region in the horizontal direction.

5. The apparatus as recited in claim 1, wherein the semiconductor material is selected from the group consisting of: silicon, silicon carbide, a binary III-V semiconductor material, a ternary III-V semiconductor material, a quaternary III-V semiconductor material, and combinations thereof.

6. The apparatus as recited in claim 1, wherein the semiconductor material comprises GaN.

7. The apparatus as recited in claim 1, wherein a total height of each 3D structure is in a range from about 0.1 µm to about 1000 µm.

8. The apparatus as recited in claim 7, wherein a height of the second region of each 3D structure is in a range from greater than 0% to less than or equal to about 100% of the total height of each 3D structure.

9. The apparatus as recited in claim 7, wherein the first region of each 3D structure comprises a lower region (a drift region) positioned between the second region and the upper surface of the substrate in a vertical direction, the vertical direction being oriented perpendicular to the upper surface of the substrate, and wherein a height of the lower region is in a range from greater than 0% to less than or equal to about 99.9% of the total height of each 3D structure.

10. The apparatus as recited in claim 1, wherein a total width of each 3D structure is in a range from about 0.001 µm to about 100 µm.

11. The apparatus as recited in claim 10, wherein a width of the second region of each 3D structure is in a range from about 1% to about 90% of the total width of each 3D structure.

12. The apparatus as recited in claim 1, wherein the gate region surrounds a periphery of each 3D structure without being in physical contact with the at least one vertical sidewall of each 3D structure.

13. The apparatus as recited in claim 1, wherein a width of the gate region is about equal to a width of the second region.

14. The apparatus as recited in claim 1, wherein the gate region is positioned entirely above the upper surface of the second region.

15. The apparatus as recited in claim 1, wherein the isolation region extends an entire distance between adjacent 3D structures, wherein the isolation region is in contact with the adjacent 3D structures.

16. The apparatus as recited in claim 1, wherein the second region is a single layer.

17. A method of forming the at least one vertical transistor as recited in claim 1, the method comprising:
forming a layer comprising the semiconductor material above the substrate;
defining the 3D structures in the layer;
forming the second region in at least one vertical sidewall of each 3D structure; and
forming the isolation region between each 3D structure.

18. The method as recited in claim 17, wherein the 3D structures are defined via at least one technique selected from a group of techniques consisting of: an etching technique and an ion implantation technique.

19. The method as recited in claim 17, wherein each 3D structure comprises the first region having the first conductivity type and the second region having the second conductivity type, the second region including a portion of at least one vertical sidewall of each 3D structure.

20. An apparatus, comprising:
at least one vertical transistor, comprising:
a substrate comprising a semiconductor material;
an array of three dimensional (3D) structures above the substrate, wherein each 3D structure comprises the semiconductor material, wherein each 3D structure comprises a first region having a first conductivity type and a second region having a second conductivity type, the second region including a portion of at least one vertical sidewall of each 3D structure;
a gate region, wherein the gate region is present on a portion of an upper surface of the second region and the gate region is coupled to a portion of the at least one vertical sidewall of each 3D structure, wherein the gate region is positioned entirely above the upper surface of the second region; and
an isolation region positioned between each 3D structure,
wherein the isolation region is positioned directly on the substrate,
wherein the isolation region is an electrically insulating material.

21. The apparatus as recited in claim 20, wherein the second region is a single layer.

22. A method of forming at least one vertical transistor, the method comprising:
forming a layer comprising a semiconductor material above a substrate;
defining three-dimensional (3D) structures in the layer, wherein the 3D structures are defined via at least one technique selected from a group of techniques consisting of: an etching technique and an ion implantation technique;
forming a second region in at least one vertical sidewall of each 3D structure; and
forming an isolation region between 3D structures, wherein the isolation region is formed directly on the substrate,
wherein the formed at least one vertical transistor comprises:
the substrate comprising the semiconductor material;
the array of 3D structures above the substrate, wherein each 3D structure comprises the semiconductor material, wherein each 3D structure comprises a first region having a first conductivity type and the second region having a second conductivity type, the second region including a portion of at least one vertical sidewall of each 3D structure;
a gate region, wherein the gate region is present on a portion of an upper surface of the second region and the gate region is coupled to a portion of the at least one vertical sidewall of each 3D structure; and
the isolation region positioned between each 3D structure, wherein the isolation region is an electrically insulating material.

* * * * *